United States Patent [19]

Archer

[11] Patent Number: 4,952,853
[45] Date of Patent: Aug. 28, 1990

[54] METHOD AND APPARATUS FOR SENSING DIRECT CURRENT OF ONE POLARITY IN A CONDUCTOR AND ELECTRONICALLY COMMUTATED MOTOR CONTROL RESPONSIVE TO SENSED MOTOR CURRENT

[75] Inventor: William R. Archer, Fort Wayne, Ind.

[73] Assignee: General Electric Company, Fort Wayne, Ind.

[21] Appl. No.: 235,995

[22] Filed: Aug. 24, 1988

[51] Int. Cl.$^5$ .............................................. G05B 1/06
[52] U.S. Cl. ...................................... 318/254; 324/127
[58] Field of Search ................ 318/254, 254 A, 255, 318/139, 138, 658, 801, 809, 812, 815, 805, 827, 740, 721, 246; 324/110, 127, 142, 158 MG

[56] References Cited

U.S. PATENT DOCUMENTS

| | | | |
|---|---|---|---|
| 3,633,095 | 1/1972 | Hood | 323/18 |
| 3,638,480 | 2/1972 | Calud | 73/134 |
| 3,671,849 | 6/1972 | Kingston | 323/24 |
| 3,702,429 | 11/1972 | Sawyer et al. | 318/227 |
| 3,739,274 | 6/1973 | DePuy | 324/120 |
| 3,806,785 | 4/1974 | DeValroger et al. | 318/254 |
| 3,914,672 | 10/1975 | Kiwaki et al. | 318/246 |
| 3,932,789 | 1/1976 | Sons et al. | 317/13 |
| 4,085,355 | 4/1978 | Fradella | 318/721 X |
| 4,255,704 | 3/1981 | Milkovic | 324/127 |
| 4,413,218 | 11/1983 | Taylor et al. | 318/771 |
| 4,417,191 | 11/1983 | Schmidt | 318/760 |
| 4,494,010 | 1/1985 | Donnelly | 307/33 |
| 4,496,883 | 1/1985 | Eastcott et al. | 318/98 |
| 4,503,938 | 3/1985 | Nomura | 187/29 |
| 4,544,982 | 10/1985 | Boothman et al. | 361/96 |
| 4,557,114 | 12/1985 | Kato et al. | 62/126 |
| 4,575,668 | 3/1986 | Baker | 318/811 |
| 4,600,872 | 7/1986 | Shepard, Jr. | 318/658 |
| 4,629,958 | 12/1986 | Kurakake et al. | 318/723 |
| 4,683,513 | 7/1987 | Miller | 361/76 |
| 4,700,131 | 10/1987 | Miller | 324/117 H |
| 4,749,940 | 6/1988 | Bullock | 324/127 |
| 4,761,605 | 8/1988 | Jochum | 324/127 X |

Primary Examiner—William M. Shoop, Jr.
Assistant Examiner—A. Jonathan Wysocki
Attorney, Agent, or Firm—Ralph E. Krisher, Jr.

[57] ABSTRACT

Apparatus and method for generating a sensing signal which is a function of a direct current flowing in a particular direction in a conductor. A core inductively coupled to the conductor is subject to negative magnetic saturation after a period of time as a result of a magnetic field generated by the direct current in the conductor. The aforesaid period of time is a function of the magnitude of the magnetic field generated by the direct current flowing in the conductor. An output winding around the core produces an output signal which is a function of the direct current in the conductor when the core is not saturated but which is not a function of the direct current in the conductor after the aforesaid period of time. A reset winding is periodically driven by a pulse to reset the magnetic orientation of the core to positive magnetic saturation before the aforesaid period of time elapses. As a result, the output signal produced between periodic resets has a magnitude which is a function of the direct current in the conductor and comprises the sensing signal. A motor voltage is applied to one or more winding stages of a motor in accordance with a regulating signal which is a function of the sensing signal. The winding stages are commutated in a preselected sequence to rotate a rotatable assembly of the motor.

70 Claims, 7 Drawing Sheets

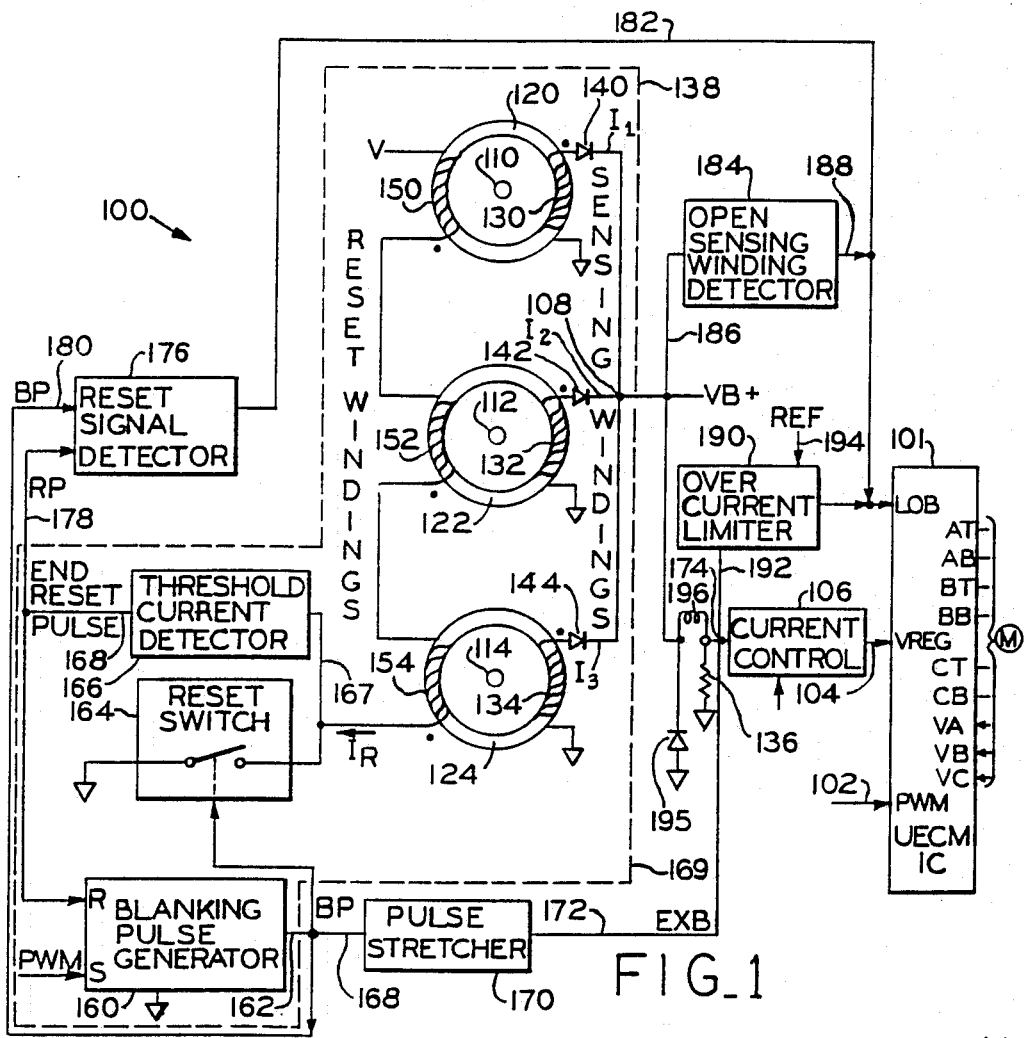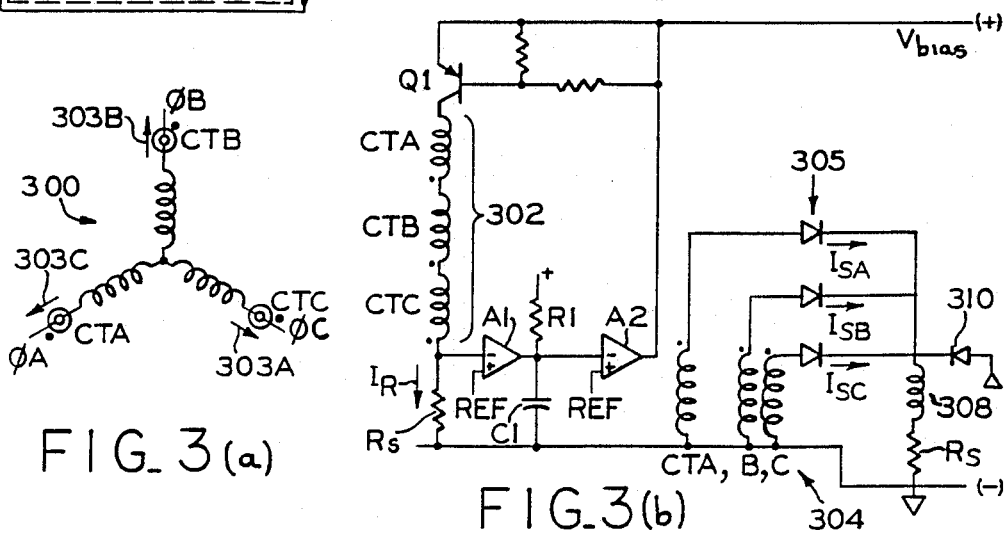

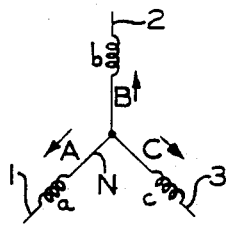
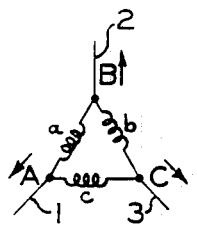
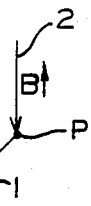
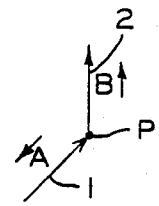
FIG_2(a)   FIG_2(b)   FIG_2(c)   FIG_2(d)
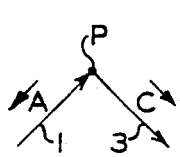
FIG_2(e)   FIG_2(f)   FIG_2(g)   FIG_2(h)
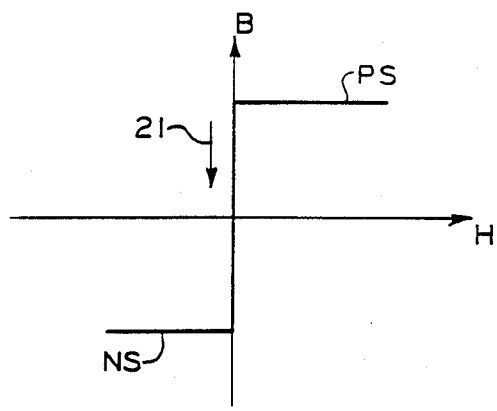
FIG_2(i)
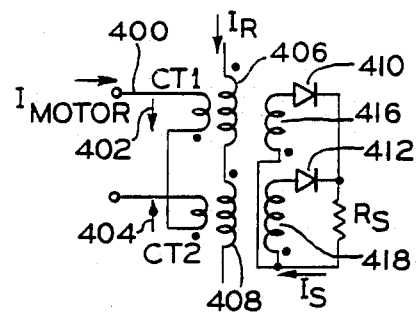
FIG_4

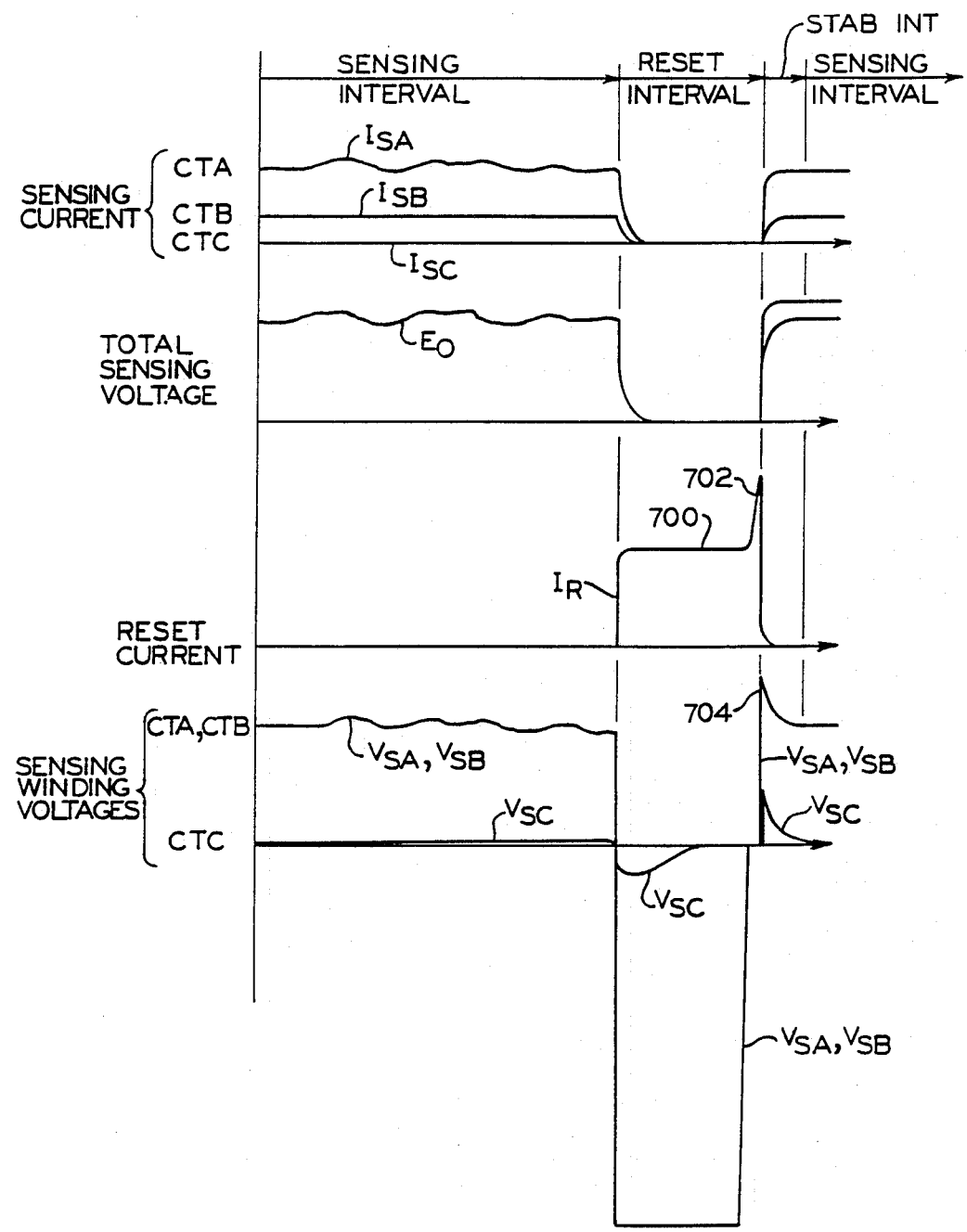
FIG_7

METHOD AND APPARATUS FOR SENSING DIRECT CURRENT OF ONE POLARITY IN A CONDUCTOR AND ELECTRONICALLY COMMUTATED MOTOR CONTROL RESPONSIVE TO SENSED MOTOR CURRENT

FIELD OF THE INVENTION

The invention relates generally to controls and methods for sensing direct current in a conductor and, more particularly, dynamoelectric machines, control systems and application systems for such machines and to methods of their control and operation utilizing electronic comutation means responsive to controls and methods for detecting the direct current in the windings of the machines.

BACKGROUND OF THE INVENTION

While conventional brush-commutated DC motors may have advantageous characteristics, including convenience of changing operational speeds, there may be disadvantages such as brush wear, electrical loss, noise and radio frequency interference caused by sparking between the brushes and the segmented commutator, which may limit the applicability of such brush-commutated DC motors in some fields such as the furnace blower control field. Electronically commutated motors, such as brushless DC motors and permanent magnet motors with electronic commutation, have now been developed and generally are believed to have the above-discussed advantageous characteristics of the brush-commutated DC motors without many of the disadvantages thereof while also having other important advantages. Such electronically commutated motors are disclosed in the David M. Erdman U.S. Pat. Nos. 4,015,182 and 4,459,519, for instance. These electronically commutated motors are advantageously employed, for instance, in various air handling applications such as air conditioning for cooling and warming.

Controls for electronically commutated motors include speed controls which generally monitor motor voltage and torque control which generally monitor effective motor current. Such torque controls generally employ a shunt resistor connected to the motor windings which taps a small portion of the motor current to generate a voltage signal across the shunt which has a magnitude directly proportional to the effective motor current. The voltage signal across the shunt is not isolated. Furthermore, high voltage motors (on the order of 400 volts) which carry substantial motor current (approximately 50 amperes) require large shunt resistors having precise resistance values which are expensive and may require cooling which adds to the cost of the controls. In such high voltage motors, the use of a shunt resistor results in the unnecessary dissipation of some power and the voltage signal generated thereby tends to have a very low signal-to-noise ratio.

SUMMARY OF THE INVENTION

Among the objects of this invention are to provide an improved control system for an electronically commutated motor, an improved electronically commutated motor, an improved electronically commutated motor system, improved motor current sensing apparatus and improved methods of control and operation which overcome at least some of the disadvantageous conditions discussed above; the provision of an improved control system for an electronically commutated motor, an improved electronically commutated motor system, improved motor current sensing apparatus and improved methods of control and operation which substantially reduces the risk of demagnetization of the permanent magnets of the motor as the result of excessive motor current in the motor windings; the provision of an improved control system for an electronically commutated motor, an improved electronically commutated motor system, improved motor current sensing apparatus and improved methods of control and operation which accurately detects and responds to the effective motor current; the provision of an improved control system for an electronically commutated motor, an improved electronically commutated motor and system which provides an isolated signal representative of the effective motor current; the provision of an improved control system for an electronically commutated motor, an improved electronically commutated motor system, improved motor current sensing apparatus and improved methods of control and operation which employ an effective motor current signal having a high signal-to-noise ratio; and the provision of an improved control system for an electronically commutated motor, an improved electronically commutated motor system, improved motor current sensing apparatus and improved methods of control and operation which are electrically efficient, reliable, economical and convenient in use.

It is another object of this invention to provide an electronically commutated motor responsive to instantaneously sensed motor current to protect the semiconductor power switching devices in the power inverter driving the motor from excessive motor currents.

It is yet another object of this invention to provide and apparatus and method for sensing direct current which is isolated from the direct current being sensed and which does not significantly dissipate the direct current.

Generally, one form of the invention is an apparatus for generating a sensing signal which is a function of a direct current flowing in a particular direction in a conductor. Means produces an output signal, the means comprising a core inductively coupled to the conductor and an output winding around the core for producing the output signal. The core is subject to magnetic saturation after a period of time as a result of a magnetic field generated by the direct current in the conductor, the aforesaid period of time being a function of the magnitude of the magnetic field generated by the direct current flowing in the conductor. The output winding produces the output signal which is a function of the direct current in the conductor when the core is not saturated but which is not a function of the direct current in the conductor after the aforesaid period of time. Means periodically resets the magnetic orientation of the core to a predefined state before the aforesaid period of time elapses whereby the output signal produced between periodic resets has a magnitude which is a function of the direct current in the conductor and comprises the sensing signal.

A further form of the invention is an apparatus for generating an isolated signal which is a function of the instantaneous total effective current in the winding stages of a motor wherein the stages are wye-connected and have a neutral point. Means produces winding output signals, the means comprising a core inductively coupled to each of the winding stages and a rectified output winding around each core. Each core is subject to magnetic saturation after a period of time as a result of a magnetic field generated by the direct current flowing in the respective winding stage toward the neutral point, the aforesaid period of time being a function of the magnitude of the magnetic field generated by the direct current flowing in the conductor. The rectified output winding around each core produces a winding output signal having a magnitude which is a function of the direct current in the respective winding stage when the direct current flows in the respective winding toward the neutral point before the aforesaid period of time and which is substantially zero when direct current flows in the respective winding toward the neutral point after the aforesaid period of time and which is substantially zero when the direct current flows in the respective winding away from the neutral point. Means periodically resets the magnetic orientation of each core to a predefined state before the aforesaid period of time elapses whereby each winding output signal produced between periodic resets has a magnitude which is a function of the direct current flowing in the respective winding stage toward the neutral point. Means sums the winding output signals and provides a sum signal corresponding thereto whereby the sum signal produced between periodic resets has a magnitude which is a function of the instantaneous sum of total effective current in the winding stages of the motor and comprises the isolated signal.

A further form of the invention is an apparatus for generating a signal which is a function of direct current in the winding stages of a motor where the winding stages carry an effective motor current. Means produces an output signal, the means comprising a core inductively coupled to each winding stage and a series array of rectified output windings, each around one of said cores. The core is subject to magnetic saturation after a period of time as a result of a magnetic field generated by the direct current in the winding stage, the aforesaid period of time being a function of the magnitude of the magnetic field generated by the direct current flowing in the conductor. The series array of rectified output windings, each around one of said cores, produces the output signal which is a function of the effective direct current in the winding stage when the cores are not saturated but which is not a function of the effective direct current in the winding stages after the aforesaid period of time. Means periodically resets the magnetic orientation of the cores to a predefined state before the aforesaid period of time elapses whereby the output signal produced between periodic resets has a magnitude which is a function of the effective direct current in the winding stages and comprises the effective motor current.

A further form of the invention is a control system for an electronically commutated motor having a stationary assembly with a plurality of winding stages for carrying a motor current and further having a rotatable assembly, and which control system is adapted to receive a control signal representing a desired operating torque or speed for the motor. Means applies a motor voltage to one or more of the winding stages at a time in accordance with a regulating signal and commutates the winding stages in a preselected sequence to rotate the rotatable assembly. Means senses the effective motor current including means for producing an output signal comprising a core inductively coupled to each winding stage and a series array of rectified output windings, each around one of the cores. Each core is subject to magnetic saturation after a period of time as a result of a magnetic field generated by the direct current in the winding stage, the aforesaid period of time being a function of the magnitude of the magnetic field generated by the direct current flowing in the conductor. The series array of rectified output windings, each around one of said cores, produces the output signal which is a function of the effective direct current in the winding stage when the cores are not saturated but which is not a function of the effective direct current in the winding stages after the aforesaid period of time. The means producing an output signal also comprises means periodically resetting the magnetic orientation of the cores to a predefined state before the aforesaid period of time elapses whereby the output signal produced between periodic resets has a magnitude which is a function of the effective direct current in the winding stages and comprises the effective motor current. Means responsive to the sensing means generates the regulating signal having a duty cycle which is a function of the control signal and the output signal, whereby the operating torque or speed of the motor is a function of the control signal.

A further form of the invention is a control system for an electronically commutated motor having a stationary assembly with a plurality of winding stages for carrying a motor current and further having a rotatable assembly, and which control system is adapted to receive a control signal representing a desired operating torque or speed for the motor, the control system for use with a commutating circuit for applying a motor voltage to one or more of the winding stages at a time in accordance with a regulating signal and for commutating the winding stages in a preselected sequence to rotate the rotatable assembly. Means senses the effective motor current including means for producing an output signal comprising a core inductively coupled to each winding stage and a series array of rectified output windings, each around one of the cores. Each core is subject to magnetic saturation after a period of time as a result of a magnetic field generated by the direct current in the winding stage, the aforesaid period of time being a function of the magnitude of the magnetic field generated by the direct current flowing in the conductor. The series array of rectified output windings, each around one of said cores, produces the output signal which is a function of the effective direct current in the winding stage when the cores are not saturated but which is not a function of the effective direct current in the winding stages after the aforesaid period of time. The means producing an output signal also comprises means periodically resetting the magnetic orientation of the cores to a predefined state before the aforesaid period of time elapses whereby the output signal produced between periodic resets has a magnitude which is a function of the effective direct current in the winding stages and comprises the effective motor current. Means responsive to the sensing means generates the regulating signal having a duty cycle which is a function of the control signal and the output signal, whereby the operating torque or speed of the motor is a function of the control signal.

A further form of the invention is an apparatus for generating a sensing signal which is a function of an effective direct current flowing in a conductor. Means produces a first output signal, the means comprising a first core inductively coupled to the conductor and a first output winding around the first core. The first core is subject to magnetic saturation after a first period of time as a result of a magnetic field generated by the direct current in one direction in the conductor, the first period of time being a function of the magnitude of the magnetic field generated by the direct current flowing in the one direction in the conductor. The first output winding around the first core produces the first output signal which is a function of the direct current in the one direction in the conductor when the first core is not saturated but which is substantially zero when current flows in the one direction after the first period of time and which is substantially zero when the current flows in the other direction. Means periodically resets the magnetic orientation of the first core to a predefined state before the first period of time elapses whereby the first output signal produced between periodic resets has a magnitude which is a function of the direct current in the one direction in the conductor. Means produces a second output signal, the means comprising a second core inductively coupled to the conductor and a second output winding around the second core. The second core is subject to positive magnetic saturation after a second period of time as a result of a magnetic field generated by the direct current in the other direction in the conductor, the second period of time being a function of the magnitude of the magnetic field generated by the direct current flowing in the other direction in the conductor. The second output winding around the second core produces the second output signal which is a function of the direct current in the other direction in the conductor when the second core is not saturated but which is substantially zero when current flows in the other direction after the second period of time and which is substantially zero when the current flows in the one direction. Means periodically resets the magnetic orientation of the second core to the predefined state before the second period of time elapses whereby the second output signal produced between periodic resets has a magnitude which is a function of the direct current in the other direction in the conductor. Means sums the first and second output signals and provides a sum signal corresponding thereto whereby the sum signal produced between periodic resets has a magnitude which is a function of the effective direct current in the conductor and comprises the sensing signal.

The invention comprehends electronically commutated motor systems and apparatus for sensing direct current improved to include circuits of the types described above and other improvements. Also, various methods of the invention involve steps for accomplishing various aspects of the control and operation of the circuits described above.

Other objects and features will be in part apparent and in part pointed out hereinafter.

BRIEF DESCRIPTION OF THE DRAWINGS

FIG. 1 is a block diagram of an electronically commutated motor control apparatus including three-phase motor current sensing of the invention;

FIGS. 2(a)-2(h) are diagrams illustrating current flow in wye and delta motor winding configurations;

FIG. 2(i) is a B-H curve of a core used as part of a current transformer of the invention;

FIG. 3(a) is a schematic diagram of a three-phase wye configured motor winding including current transformers used for sensing motor current in accordance with the invention;

FIG. 3(b) is a schematic diagram of an electronically commutated motor control circuit including three-phase motor current sensing of the invention;

FIG. 4 is a schematic diagram of an apparatus of the invention for sensing direct current in any polarity in a conductor.

FIG. 7 is a set of waveform diagrams of the input and output signals, respectively, of the apparatus of FIG. 3;

Corresponding reference characters indicate corresponding parts throughout the several views of the drawings.

DETAILED DESCRIPTION OF PREFERRED EMBODIMENTS

Figure 5:
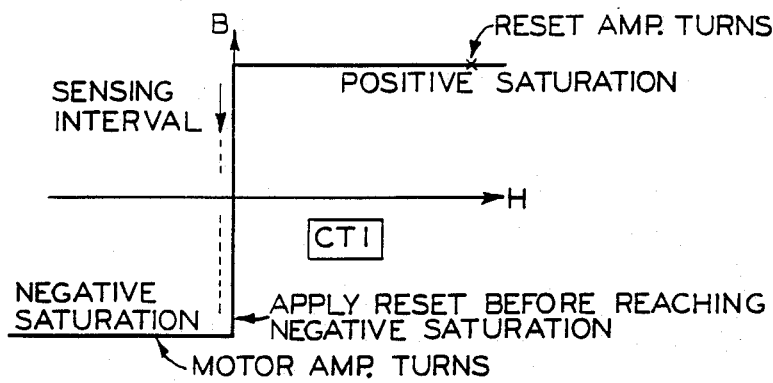
FIGS. 5 and 6 are B-H curves of the current transformers illustrated in FIG. 4.

Referring to FIG. 1, reference character 100 generally refers to an electronically commutated motor control apparatus responsive to three-phase motor current sensing according to the invention. In general, the invention senses the direct current in one direction (or of one polarity) in a conductor, i.e., an apparatus for generating a sensing signal which is a function of a direct current flowing in a particular direction in a conductor. For a single conductor or one phase motor as illustrated in FIG. 4, two current transformers are inductively coupled to the single conductor, one transformer for sensing (measuring) the current in one direction and the other transformer for sensing the current in the opposite direction. Each transformer is initially saturated and subsequently only senses current flowing in the same direction as its polarity so that the total current sensed by the transformers is a function of the total current in the conductor regardless of polarity. Current flowing in the opposite direction (non-sensing) maintains the transformer in saturation and is not sensed by that transformer.

In three phase motor current sensing as illustrated in FIG. 1, one current transformer is inductively coupled to each motor phase to measure the current in one direction for each motor phase. When the motor windings are in a wye configuration as illustrated in FIG. 2(a), each current transformer A, B, C is inductively coupled to one of the motor windings a, b, c, respectively, to sense current flowing away from the neutral point N. When the motor windings are in a delta configuration as illustrated in FIG. 2(b), each current transformer A, B, C is inductively coupled to a phase lead (terminal) of the delta to sense current flowing out of the delta. To sense the current in the motor leads of a delta configuration, each motor lead would require two current transformers (see FIG. 4).

In either a wye or delta configuration, there are many possible paths of current flow during a particular commutation interval, six typical ones are illustrated in FIGS. 2(c) through 2(h). Each transformer only measures current flowing in the same direction as its polarity so that the total current measured by the transformers is a function of the total effective motor current. In each configuration, the sensing signals from the transformers are summed, such as by resistor 136 of FIG. 1, to provide the total effective motor current sensed. The arrows adjacent reference characters A, B, and C indicate the sensing direction of transformer A, B, and C, respectively. Point p corresponds to the neutral point N in the wye configuration or to the delta in the delta configuration. The arrows along conductors 1, 2, 3 indicate the direction of current flow of that conductor.

In FIG. 2(c), current flows along conductor 2 toward point p and along conductor 1 away from point p. Transformer A senses the current flowing in conductor 1 because it is polarized in the same direction as the current flowing through conductor 1 whereas transformer B does not sense current flowing in conductor 2 because it is polarized in the opposite direction as the current flowing through conductor 2. Therefore, the current sensed by transformers A and B equals the current sensed by only transformer A which is the total effective motor current.

In FIG. 2(d), current flows along conductor 1 toward point p and along conductor 2 away from point p. Transformer B senses the current flowing in conductor 2 because it is polarized in the same direction as the current flowing through conductor 2 whereas transformer A does not sense current flowing in conductor 1 because it is polarized in the opposite direction as the current flowing through conductor 1. Therefore, the current sensed by transformers A and B equals the current sensed by only transformer B which is the total effective motor current.

In FIG. 2(e), current flows along conductor 1 toward point p and along conductor 3 away from point p. Transformer C senses the current flowing in conductor 3 because it is polarized in the same direction as the current flowing through conductor 3 whereas transformer A does not sense current flowing in conductor 1 because it is polarized in the opposite direction as the current flowing through conductor 1. Therefore, the current sensed by transformers A and C equals the current sensed by only transformer C which is the total effective motor current.

In FIG. 2(f), current flows along conductor 3 toward point p and along conductor 1 away from point p. Transformer A senses the current flowing in conductor 1 because it is polarized in the same direction as the current flowing through conductor 1 whereas transformer C does not sense current flowing in conductor 3 because it is polarized in the opposite direction as the current flowing through conductor 3. Therefore, the current sensed by transformers A and C equals the current sensed by only transformer A which is the total effective motor current.

In FIG. 2(g), current flows along conductors 2 and 3 toward point p and along conductor 1 away from point p. Transformer A senses the current flowing in conductor 1 because it is polarized in the same direction as the current flowing through conductor 1 whereas transformers B and C do not sense current flowing in conductors 2 and 3 because they are polarized in the opposite direction as the current flowing through conductors 2 and 3. Therefore, the current sensed by transformers A, B and C equals the current sensed by only transformer A which is the total effective motor current.

In FIG. 2(h), current flows along conductors 2 and 3 away point p and along conductor 1 toward from point p. Transformers B and C sense the current flowing in conductors 2 and 3 because they are polarized in the same direction as the current flowing through conductors 2 and 3 whereas transformer A does not sense current flowing in conductor 1 because it is polarized in the opposite direction as the current flowing through conductor 1. Therefore, the current sensed by transformers A, B and C equals the total current sensed by only transformers B and C which is the total effective motor current. Therefore, apparatus 100 generates an isolated signal which is a function of the instantaneous total effective current in the winding stages of a motor wherein the stages are wye-connected and have a neutral point.

Reference character 101 refers to an integrated circuit (IC) which is generally a universal IC for use as a commutating circuit in combination with an electronically commutated motor. Such an IC is described in coassigned U.S. Pat. No. 4,500,821 to Bitting, et al., incorporated herein by reference. IC 101 constitutes means for applying a voltage to one or more of the winding stages of an electronically commutated motor M at a time. The applied voltage has a duty cycle which is a function of a pulsed signal applied to PWM input port 102. IC 101 commutates the winding stages of the electronically commutated motor in a preselected sequence to rotate the rotatable assembly of the motor. IC 101 includes a pulse width modulated (PWM) pulse generator internal thereto adapted to provide an oscillating signal, i.e., a PWM series of pulses, having a duty cycle controlled, in part, by a voltage applied to voltage regulation input port 104. When the invention determines that the motor current is less than a desired reference, a signal is applied to input port 104 instructing IC 101 to apply a voltage to the motor windings until the current is greater than the desired reference. Current control 106 has an input connected to summing junction 108 (via junction 174, inductor 196 and sensing resistor 136) which provides a signal having a current magnitude which is a function of the motor current. Current control 106 compares this current signal to a desired or preset reference to generate an output to be applied to VREG input 104 of IC 101 when the current representative signal is below the desired or reference signal to which it is being compared.

Motor leads 110, 112 and 114 are conductors which are connected to the three phases of the motor windings of the stator of the motor M. In a wye configuration as shown in FIG. 2(a), the current passing through first phase motor lead 110 equals the current in the first phase motor winding, the current passing through second phase motor lead 112 equals the current of the second phase motor winding and the current passing through third phase motor lead 114 equals the current in the third phase motor winding. In a delta configuration as shown in FIG. 2(b), each lead is connected to one terminal of the delta. The invention generates an isolated signal which is a function of and thereby represents the total effective motor current in all three phases independent of whether the motor windings are connected in a wye or delta configuration. A core, such as a toroidal ferromagnetic member, is inductively coupled to each of the motor leads which carries current to be detected. First toroidal core 120 is located around first phase motor lead 110 so that lead 110 passes coaxially through toroidal core 120 as a single turn winding. Similarly, second toroidal core 122 is located around second phase motor lead 112 so that lead 112 passes coaxially through toroidal core 120 to form a single winding. Similarly, third toroidal core 124 is located around third phase motor lead 114 so that lead 114 passes coaxially through toroidal core 124 to form a single winding thereabout.

Two additional windings are inductively coupled on each of the toroidal cores, a reset winding and a sensing (or output) winding. It is contemplated that a single winding may be located on the toroidal core to function as both a reset winding and a sensing winding.

In general, the reset windings are open circuits except during reset intervals as will be noted below. Each toroidal core is said to be in a SENSING MODE when it has a motor winding having current flowing with the same polarity as the polarity of the sensing winding. Each sensing winding in a sensing mode functions as a current transformer to generate a current signal having a magnitude which is a function of the current in the motor windings.

For the purposes of simplicity and in order to facilitate description of the invention, it is assumed that each of the toroidal cores 120, 122 and 124 is essentially an ideal core having a B-H loop as shown in FIG. 2(i). Each toroidal core in a sensing mode is changing from a state of positive saturation PS toward a state of negative saturation NS and can be viewed with respect to ampere turns. The ampere turns of any winding on a core is equal to the product of the turns of the winding multiplied by the current in the winding. Faraday's law demands that the net ampere turns of each toroidal core in a sensing mode must be zero so that a current, I-sense, must flow out of each of the sensing windings during the sensing interval in opposition to the current flowing in the single turn motor winding associated with each toroidal core in a sensing mode. The reset windings are open circuits during the sensing interval and have no effect with respect to Faraday's law. During the sensing interval, a core in the sensing mode is moving from positive saturation PS toward negative saturation NS. Until the core becomes magnetically negatively saturated, each sensing winding in the sensing mode generates a current signal which is accurately proportional to the current in the motor winding. Negative saturation of a core in the sensing mode would result in its associated sensing winding being unable to generate a proportional current signal. This is because the balanced ampere turns rule according to Faraday's law is only valid when the core is in the linear or vertical portion of its B-H curve as indicated by arrow 21. Once a core becomes negatively or positively saturated and has a magnetic orientation which is located along the non-linear or horizontal portion of the B-H curve indicated by NS or PS, the balanced ampere turns rule is no longer applicable. Therefore, the ampere turns of each motor winding must equal the ampere turns of the sensing winding of each toroidal core during the sensing mode. Specifically, if core 100 is in a sensing mode, the ampere turns of first phase motor lead 110 must equal the ampere turns of a first phase sensing winding 130; if core 122 is in a sensing mode, the ampere turns of second phase motor lead 112 must equal the ampere turns of a second phase motor winding 132; and if core 124 is in a sensing mode, the ampere turns of a third phase motor winding 114 must equal the ampere turns of third phase motor winding 134.

Rectifying diodes 140, 142, 144 are in series with sensing windings 130, 132, 134 and enable the sensing winding to generate isolated signals representative of the motor current. Further, the diodes establish the polarity of the sensing windings (as indicated by the polarity dots) so that the sensing signals can be summed at junction 108. When a core is saturated, its sensing winding looks like a short circuit. This is because the permeability of a saturated core is zero so that the core does not effect drive signals applied to the sensing windings (unless the drive signal results in greater ampere turns than the motor current and drives the core out of saturation). As a result, a sensing winding of a saturated core looks like a short circuit (because it has very little inductance and resistance) to signals applied to the sensing winding. Without the rectifying diodes, such a sensing winding would act as a short circuit to short the other sensing windings. Even if one (or two) of the current transformers is positively saturated, the rectifying diodes permit any current transformers that are in the sensing mode to drive positive current into the sensing resistor 136. The rectifying diodes essentially disconnect each sensing winding from currents generated by the other sensing windings. This disconnect is also necessary because the sensing windings are connected in parallel to provide a summed current signal representing the effective motor current. In addition, this disconnect permits the reset operation of the core to occur without any effect from the sensing windings. Without this disconnect, the reset winding would have to drive a current through the sensing windings and the sensing resistor.

When a core is in a sensing mode, the total ampere turns of its sensing windings and the total ampere turns of its motor windings will always balance. For example, if there is one turn and 100 amperes in its motor winding, and if there are 100 turns in its sensing winding, then there will be one ampere in its sensing winding during the sensing mode so that $1 \times 100 = 100 \times 1$.

When a core is in the sensing mode, the voltage across its sensing winding will equal the product of the current that must flow within the sensing winding to balance the ampere turns multiplied by the resistance on its sensing circuit. With regard to current flow as defined in FIGS. 2(c)–2(f), the voltage across first phase sensing winding 130 in the sensing mode equals the voltage drop across rectifying diode 140 plus the current which must flow to balance the ampere turns of first phase motor lead 110 times the resistance of resistor 136 and inductor 196. Similarly, the voltage across second phase sensing winding 132 in the sensing mode equals the voltage drop across diode 142 plus the current which must flow to balance the ampere turns of second phase motor lead 112 times the resistance of resistor 136 and inductor 196. Similarly, the voltage across third phase sensing winding 134 in the sensing mode equals the voltage drop across diode 144 plus the current which must flow to balance the ampere turns of third phase motor lead 114 times the resistance of resistor 136 and inductor 196. With regard to current flow as defined in FIGS. 2(g) and 2(h), the voltage across each sensing winding equals the voltage drop across the rectifying diode plus voltage drop across resistor 136 and inductor 196. This latter voltage drop is the additive result of the two currents flowing into resistor 136 through inductor 196.

Essentially, each sensing winding 130, 132, 134 during the sensing mode is a current source which will force its ampere turns to equal the ampere turns of the associated motor lead regardless of the conditions of the circuitry, i.e., regardless of the voltage required across the sensing winding.

Initially, each core is reset into positive saturation as shown in FIG. 2(i) by reference character PS. Each core 120, 122, 124 and its sensing winding 130, 132, 134 constitute means for producing an output signal. As current flows through each of the motor windings, each toroidal core in the sensing mode begins to become less magnetically positively saturated as indicated by arrow 21. Each magnetic core not in a sensing mode is held at positive saturation. Eventually, the toroidal cores 120, 122, 124 in the sensing mode would become magnetically negatively saturated as indicated by reference character NS because direct current is flowing through each of the motor leads 110, 112, 114 for a substantial period of time, i.e., each core is subject to magnetic saturation after a period of time as a result of a magnetic field generated by the direct current in its associated motor lead (conductor), the aforesaid period of time being a function of the magnitude of the magnetic field generated by the direct current flowing in the associated lead. Each sensing winding 130, 132 and 134 is an output winding around its associated core for producing the output signal which is a function of the direct current in the conductor when the core is not saturated but which is not a function of the direct current in the conductor after the aforesaid period of time. The purpose of the reset windings is to reset the magnetic orientation of the toroidal cores to positive saturation PS so that each of the cores is less negatively magnetically saturated. Therefore, each reset winding 150, 152, 154 constitutes means for periodically resetting the magnetic orientation of its respective core to a predefined state before the aforesaid period of time elapses whereby the output signal produced between periodic resets has a magnitude which is a function of the direct current in the conductor and comprises the sensing signal. Thus, resetting occurs during a reset interval which begins before any of the toroidal cores becomes magnetically negatively saturated. The reset interval occurs periodically to avoid magnetic negative saturation of any of the toroidal cores. All cores are reset even though some cores may already be positively saturated. This avoids the need for monitoring each core to determine which are in the sensing mode and only resetting those cores.

As a core in a sensing mode changes state from positive saturation PS toward negative saturation NS, its sensing winding generates a current signal which is proportional to the current in the motor winding. Negative saturation of a core would result in its associated sensing winding being unable to generate a proportional current signal. This is because the balanced ampere turns rule according to Faraday's law is only valid when the core is in the linear or veritical portion of its B-H curve as indicated by arrow 21. Once a core becomes negatively saturated and has a magnetic orientation which is located along the non-linear or horizontal portion of the B-H curve indicated by NS, the balanced ampere turns rule is no longer applicable. Therefore, operation of the reset windings during the reset interval must occur at a periodic rate sufficient to ensure that each of the toroidal cores is within the vertical portion of its respective B-H curve in order to provide legitimate current sensing during the sensing interval. During the reset interval, the current signal generated by the sensing windings does not represent the motor current. After the reset interval, a brief stabilization interval may be required before a toroidal core once again enters the state which corresponds to the linear portion of its B-H curve so that its sensing winding generates a current signal representative of the current in its motor lead.

During the reset interval, a current is driven through the reset windings to overpower the number of ampere turns of the motor winding and drive each of the toroidal cores into positive magnetic saturation. Preferably, each toroidal core is magnetically positively saturated as a result of this voltage signal applied to the reset winding during the reset interval. After the toroidal cores reach positive saturation, activation of the reset windings is discontinued and the reset windings are once again open circuits. Thereafter, the balanced ampere turns rule of Faraday's law is again applicable to each toroidal core in the sensing mode and its sensing winding generates a current signal proportional to the current of its motor winding.

The reset windings are comprised of a first phase reset winding 150 wound around first toroidal core 120, a second phase reset winding 152 wound around second toroid 122 and a third phase reset winding 154 wound around third toroid 124. The direction in which the windings are wound is not critical. The polarity of the connections to the reset windings determines the direction in which the core is driven, i.e., negative or positive saturation. The polarity of the connections to the sensing winding determines whether the core remains saturated or changes state as a result of motor current flowing through the conductor which is inductively coupled to the core. The reset windings are connected oppositely to the sensing windings so that the reset windings are driven by a signal which forces the magnetic orientation of the core in a direction opposite to the direction that the core is forced by the sensing windings. Preferably, the reset windings are connected in series so that a single voltage signal may be applied across the series array.

The width of a blanking pulse generated by blanking pulse generator 160 defines the reset interval. The generation of the blanking pulse is coordinated with the pulse width modulated (PWM) signal so that the reset interval occurs during a period when none of the power devices which apply a voltage to the motor windings is being turned on. During the reset interval a sensing current signal is not being generated. In order to prevent a sudden increase in effective motor current during the reset interval due to a motor fault (such as lost position, locked rotor, etc.), the power devices are prevented from being turned on during the reset interval. In addition, events which result in a condition which would unacceptably increase current in a motor winding are prohibited during the reset interval. Such events are prohibited to avoid an overcurrent condition. Therefore, if the power devices remain on or are turned off during the reset interval, these events do not present a condition which would result in an unacceptable increase in current and may occur during the reset interval. Blanking pulse generator 160 has a set (S) input for receiving the pulse width modulated (PWM) signal so that the blanking pulse provided by its output 162 is synchronized with each pulse of the pulse width modulated signal. The blanking pulse is provided to a control input of reset switch 164 to close the reset switch thereby applying a reset voltage across the reset winding array and beginning the reset interval. The period during which reset switch 164 is closed is the reset interval.

As current initially flows through the reset windings, it is inhibited by the inductance of the reset windings and by the inductive coupling to the toroidal cores which oppose such current flow. As current begins to flow through the reset windings, the toroidal cores become less negatively saturated and become more magnetically positively saturated. As a result, the current flow through the reset windings begins to increase rapidly. Threshold current detector 166 monitors the current ($I_{reset}$) flowing through the reset windings via line 167. As soon as the current magnitude reaches a preset amount, say one ampere, as detected by threshold current detector 166, this indicates that the reset windings are positively saturated. Detector 166 then generates an end reset pulse via line 168 which is applied to the reset (R) input of blanking pulse generator 160 to turn off the generator and discontinue the blanking pulse.

The blanking pulse from output 162 is also provided via line 168 to pulse stretcher 170 and the stretched pulse is provided via line 172 to output junction 174 constituting means for summing the sensing (winding) output signals and providing a sum signal corresponding thereto whereby the sum signal produced between periodic resets of the sensing windings has a magnitude which is a function of the instantaneous sum of total effective current in the winding stages of the motor and comprises the isolated signal. The blanking pulse is essentially used to ground output junction 174 to prevent a transient current sensing signal from being applied to current control 106 during the reset interval. Pulse stretcher 170 is a circuit for slightly extending the width of the blanking pulse in order to permit the toroidal cores to stabilize or settle after completion of the reset interval and before the next sensing interval. The toroidal cores and their associated sensing windings constitute means including a core inductively coupled to a conductor (motor winding) for producing a sensing signal when the core is not saturated, the sensing signal having a magnitude which is a function of the direct current in the conductor. Blanking pulse generator 160, reset switch 164, threshold current detector 166 and the reset windings 150, 152, 154 constitute means 169 for periodically resetting the magnetic orientation of each core to a predefined state before the aforesaid period of time elapses whereby each winding output signal produced between periodic resets has a magnitude which is a function of the direct current flowing in the respective winding stage toward the neutral point, i.e., before it becomes magnetically saturated as a result of the magnetic field generated by the direct current in the conductor.

Apparatus 100 as illustrated in FIG. 1 is also provided with optional protective circuitry. Reset signal detector 176 is provided with the signal pulse via line 178 and is provided with the blanking pulse via line 180 in order to verify that a reset signal has been applied to energize the reset windings during the reset interval thereby resetting the toroidal cores. In the event that a reset signal is not generated in response to a blanking pulse, reset signal detector 176 provides a disable signal via line 182 to the lockoff input (LOB) of IC 101 thereby shutting down the apparatus to prevent damage to the motor. In addition, open sensing winding detector 184 monitors the current sensing signal provided by the sensing windings at junction 174 via line 186. Detector 184 detects the presence of the positive transient spike 704 (see FIG. 7) induced in the sensing winding at the beginning of the stabilization interval. If transient spike 704 is absent, an open circuited sensing winding is suggested. In response to this absence of the transient, a disable signal is provided by the output of open reset winding detector 184 via line 188 to the lockoff input (LOB) of IC 101. In addition, overcurrent limiter 190 monitors the sensing current signal at output point 174 via line 192 and compares it to a preset reference 194. When the sensing current signal at point 174 is greater than the preset reference 194, this indicates that the total motor current is greater than a desired maximum and the output of limiter 190 provides a disable signal to the lockoff input (LOB) of IC to shut down the apparatus.

Inductor 196, located in series between the cathode of rectifying diodes 140, 142 and 144 and sensing resistor 136, reduces the settling (stabilization) time of toroidal cores after reset. Inductor 196 provides the summation of the current signals which are generated by sensing windings 130, 132, 134 and which represent the total motor current. The sensing windings are subjected to transients generated by the switching of the reset windings on and off. When a potential difference is applied to the reset windings, the reset windings inductively overpower the motor current so that the current in the sensing winding goes to zero. However, stray capacitors and inductors in the circuitry prevent the sensing current from going to zero instantaneously. Therefore, transients are developed in the sensing winding. Inductor 196 filters the leading edge of the transients and inhibits current build-up in the sensing windings during the leading edge of the stabilization interval after the reset interval and before the sensing interval. Free wheeling diode 195 permits energy stored in inductor 196 at the end of the sensing interval to free wheel through resistor 136 without flowing in sensing windings during the start of the reset interval.

The stabilization or settling interval is a short period of time (approximately ten microseconds) between the reset interval and the sensing interval. After the reset pulse is applied to the reset windings and is completed, reset switch 164 is turned off. At that instant, the circuit is in the sensing mode and should be sensing again. However, it takes time for the current to decay in the reset windings. As the current is decaying in the reset windings, it is tending to build up a corresponding current in the sensing windings. Because the reset windings have been overdriven to force the cores into positive saturation, i.e., the equivalent of 200 amps of motor current has been applied to the cores, the cores are in a state responding to the apparently significant amount of motor current. When the reset windings are suddenly turned off at the end of the reset interval, the apparently excessive ampere turns generate current in the sensing windings. The sensing windings begin to replace the reset windings and begin to generate a current corresponding to the reset current. In order to avoid an output signal from the sensing windings indicating a significant amount of current and resulting in system shut down, this transient is dissipated quickly before it has time to build up in the sensing windings by inductor 196. Inductor 196 acts as a filter to prevent the transient from building up quickly in the sensing winding. During the reset interval, the current in the sensing windings goes to zero. In other words, the current in the sensing winding initially begins to approach the current needed to balance the ampere turns of the reset winding. The sensing windings are responding to a false signal created by excess energy at the instant that the reset switch 164 is turned off. Inductor 196 filters the leading edge of this transient and slows down the current build-up in the sensing windings. By the time the circuit is stabilized and achieves normal regulation levels, the transient has dissipated.

Referring to FIGS. 3(a) and 3(b), a wye-connected, three-phase electronically commutated motor 300 is schematically shown with each of the three-phase windings, A, B, C, passing through a toroidal core as a single winding, the toroidal core being part of a current transformer CTA, CTB, CTC according to the invention. FIG. 3(b) shows the reset and sensing circuits of the invention which are associated with current transformers CTA, CTB and CTC. In both FIGS. 3(a) and 3(b), polarity dots are used to indicate the polarity of each winding thereby indicating the polarity of each of the windings with respect to the current flow. Transistor reset switch Q1 is initially conducting to apply a $V_{bias}$ to the sensing windings 302 of the three current transformers. These windings are typically 100 turns each. When all three cores have been saturated by the current driven through the sensing windings resulting from $V_{bias}$, the impedance of each of the sensing windings is reduced to nearly zero because the permeability of the cores becomes zero. This causes the reset current $I_{reset}$ to suddenly increase in magnitude. The increase in reset current is detected by resistor $R_s$ and compared to a reference voltage by comparator A1. When a specific level of reset current is reached, say one amp, the output of comparator A1 goes low to discharge capacitor C1. This causes comparator A2, which is comparing the output of comparator A1 to a reference, to provide a high output because the output of comparator A1 is low and is, therefore, less than the reference. The high output by comparator A2 applied to the base of Q1 turns transistor reset switch Q1 off and terminates the reset phase of the cycle.

The stabilization interval follows the reset interval and provides a short period of time during which inductor 308 dissipates transients generated in the sensing windings by the energy stored in the reset windings. Thereafter, the sensing interval begins with all three cores at positive saturation. If the ampere turns generated by the motor current are in the positive direction in any core, that core will remain positively saturated and its sensing winding will be at zero volts. Thus, negative motor current is not measured. Arrows 303A, 303B, and 303C indicate the sensing direction of transformers CTA, CTB and CTC, respectively. If the ampere turns generated by the motor current are negative, this will result in the core of that particular transformer coming out of saturation during the sensing mode. As indicated above, Faraday's law demands that the net ampere turns of each core be zero so that a current, $I_{sense}$, must flow out of each sensing winding opposing the ampere turns flowing in the one turn of the motor winding. Reset windings 302 are open circuited because transistor reset switch Q1 is not conducting so that the reset windings do not affect the balancing between the ampere turns of the motor winding and the sensing windings as required by Faraday's law. In effect, each sensing winding 304 in a sensing mode becomes a constant current source with its ampere turn magnitude being set by the motor winding ampere turns. If each of the sensing windings 304 is 100 turns, then the sensing current, $I_{sense}=I_{SA}+I_{SB}+I_{SC}$, will be 1/100 of the main motor current. The sensing polarities were discussed above with regard to FIG. 2. In the special case where two of the current transformers have positive ampere turns, such as due to an out of position operation of the motor, then the current total flowing in resistor R sense will be the algebraic sum of these currents.

The sensing interval continues until the time constant defined by the combination of resistor R1 and capacitor C1 results in the output of comparator A1 being high so that comparator A2 goes low, turning on transistor reset switch Q1 and thus starting the stabilization interval. Once the core size and the value of the sensing resistor are selected, and the maximum current is known, there is a period time for the sensing mode after which the core must be reset. In general, the period is a function of the magnitude and duration of the magnetic field generated by the flowing direct current. The stabilization interval can be timed by a free-running timer as shown in FIG. 3 or it can be synchronized to a clock as shown in FIGS. 1 and 8. In practice, the time constant is set so that the reset interval will begin before negative saturation of a core occurs. Typically, excursion from positive saturation of 50-70% of the available flux of the core could be allowed. As a result, the circuit of FIG. 3(b) produces an accurate (less than 1% error), isolated sensing current $I_s$ representing the summation of all the effective current in the three leads of motor windings A, B and C. Except for the reset interval and subsequent stabilization interval, the resistor $R_s$, behaves as a d.c. summing shunt. As indicated with respect to FIG. 1, appropriate filtering and/or blanking can be applied to $E_O$ as required. As noted above, rectifying diodes 305 permit each of the sensing windings to sense the motor current without shorting out the other windings.

FIGS. 4(a) and 4(b) illustrate the invention in a single phase configuration where the current in a conductor 400 is being sensed and constitute apparatus for generating a sensing signal which is a function of an effective direct current flowing in a conductor. In general, the direction of the current will be unknown so that two current transformers CT1, CT2 must be inductively coupled to conductor 400 to sense the current in either direction. Essentially, transformers CT1 and CT2 are in opposition to each other and sense current in opposite directions. This permits the circuit of FIG. 4(b) to measure current through conductor 400 regardless of its polarity. If the direction of current is known, only one current transformer is required as long as the polarity of it is controlled to be the same as the direction of current flow.

Figure 6:
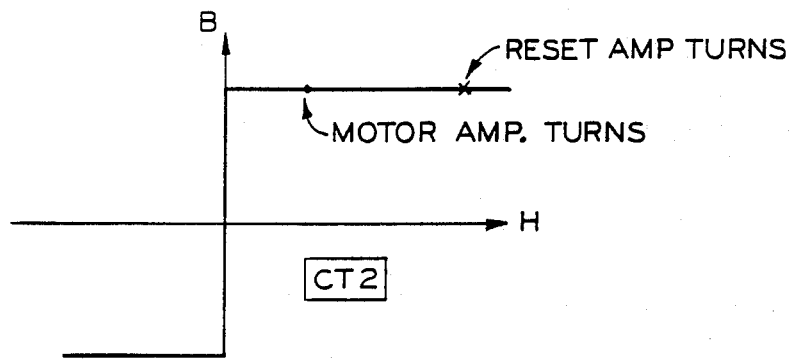

Referring to the polarity dots defining the polarity of the windings of FIG. 4, the polarity of the single winding of transformer CT1 of conductor 400 as indicated by arrow 402 is opposite the polarity of the single winding of transformer CT2 as indicated by arrow 404. In contrast, the polarity of the reset winding 406 of CT1 is the same as the polarity of the reset winding 408 of CT2. Therefore, a reset pulse applied to the reset windings will positively saturate the core of both CT1 and CT2 as indicated in FIGS. 5 and 6. Similarly, the polarity of both of the sensing windings 414 and 416 is the same. The polarity of the sensing windings is opposite the polarity of the reset windings so that the reset pulse will drive the cores into positive saturation whereas the motor current, depending on its direction, will only drive one of the transformers into positive saturation and hold it there while driving the other transformer toward negative saturation in a sensing mode. This transformer in the sensing mode that is being driven toward negative saturation will generate a sensing current according to Faraday's law. The rectifying diodes 410 and 412 associated with each of the sensing windings array isolates the winding so that one winding does not short out the other. The voltage signal across sensing resistor $R_s$ will always be a positive magnitude and directly proportional to the magnitude of the motor current in conductor 400.

Therefore, means for producing a first output signal constitutes a first current transformer CT1 having a first core inductively coupled to the conductor 400, said first core being subject to magnetic saturation after a first period of time as a result of a magnetic field generated by the direct current in one direction (shown by arrow 402) in the conductor 400, the first period of time being a function of the magnitude of the magnetic field generated by the direct current flowing in the one direction in the conductor 400; said first current transformer also having a first output (sensing) winding 416 around said first core for producing the first output signal which is a function of the direct current in the one direction in the conductor 400 when the first core is not saturated but which is substantially zero when current flows in the one direction after the first period of time and which is substantially zero when the current flows in the other direction. Means in the form of reset winding 406 periodically resets the magnetic orientation of the first core to a predefined state (such as positive magnetic saturation) before the first period of time elapses whereby the first output signal produced between periodic resets has a magnitude which is a function of the direct current in the one direction in the conductor 400.

In addition, means for producing a second output signal constitutes a second current transformer CT2 having a second core inductively coupled to the conductor 400, said second core being subject to positive magnetic saturation after a second period of time as a result of a magnetic field generated by the direct current in the other direction (shown by arrow 404) in the conductor 400, the second period of time being a function of the magnitude of the magnetic field generated by the direct current flowing in the other direction in the conductor 400; said second current transformer also having a second output (sensing) winding 418 around said second core for producing the second output signal which is a function of the direct current in the other direction in the conductor 400 when the second core is not saturated but which is substantially zero when current flows in the other direction after the second period of time and which is substantially zero when the current flows in the one direction. Means in the form of reset winding 408 periodically resets the magnetic orientation of the second core to the predefined state (such as positive magnetic saturation) before the second period of time elapses whereby the second output signal produced between periodic resets has a magnitude which is a function of the direct current in the other direction in the conductor 400.

Sensing resistor $R_s$ constitutes means for summing the first and second output signals and providing a sum signal across $R_s$ corresponding thereto whereby the sum signal produced between periodic resets has a magnitude which is a function of the effective direct current in the conductor 400 and comprises the sensing signal.

Referring to FIG. 7, waveform diagrams of the FIG. 3(b) circuit are shown. The waveforms illustrate the general case where two current transformers, CTA and CTB are sensing thereby generating time varying, positive dc values and one current transformer, CTC, is being maintained in positive saturation by the motor current. This type of current flow corresponds to the current flow illustrated in FIG. 2(h). During the sensing interval, current transformer CTA generates a sensing current $I_{SA}$ and current transformer CTB generates a sensing current $I_{SB}$. Transformer CTC is maintained in positive saturation by the motor current and therefore generates a zero current $I_{SC}$. The total $I_S$ of these currents flows through sensing resistor $R_s$ to generate a voltage $E_O$ across resistor $R_s$. During the sensing interval, the reset current $I_R$ is zero because the reset windings are open circuited, reset switch Q1 is non-conductive, and no reset pulse is being applied to the reset windings. During the sensing interval, the voltage $V_{sa}$ across sensing winding A and the voltage $V_{sb}$ across sensing winding B are each positive while the voltage $V_{sc}$ across sensing winding C is zero because it is positively saturated.

During the reset interval, a reset pulse is applied to the reset winding array to drive each of the cores into positive saturation. Therefore, the reset current $I_R$ increases to a positive value as indicated by reference character 700. Due to the rectifying diodes D16, D17, D18 in series with each of the sensing windings, the sensing current goes to zero almost immediately. However, there is a slight taper in the decrease of the reset currents and consequently a slight taper in the decrease of the voltage $E_O$ due, in part, to the inductance of stabilizing inductor 308. Also, a slight negative voltage $V_{sc}$ is generated by sensing winding C. This negative voltage $V_{sc}$ of positively saturated core C results from transient coupling between the reset and sensing windings and depends on the non-ideal nature of the core and the hysteresis loop of its BH curve. Toward the end of the reset interval, the cores become positively saturated which means their permeability equals zero. Therefore, the reset current suddenly begins to increase as indicated by reference character 702. During spike 702, the sensing voltages across the sensing windings each goes to zero. The reset interval is then terminated by either the discharge of capacitor C1 (or by the threshold current detector 166 of FIG. 1).

Thereafter, the stabilization interval begins providing a relatively short period of time during which the voltages and currents within the circuit are stabilized by inductor 308. Initially, the voltages across sensing windings A and B spike upward and then taper off. This transient spike 704 is the result of the sudden cut-off of the reset pulse, as noted above. Consequently, the sensing currents gradually approach their sensing levels.

The transient spike 704 in the sensing voltage and the gradual increase in the sensing current is the result of the inductance of inductor 308. Sensing current is flowing in sensing windings of transformers in the sensing mode during the sensing interval. As the reset interval begins, the sensing current results in energy stored in inductor 308. Free wheeling diode 310 allows energy in inductor 308 to free wheel through resistor $R_s$ without a significant amount of current flow in the sensing windings. Thereafter, the sensing interval begins again as indicated above.

Figure 8A:
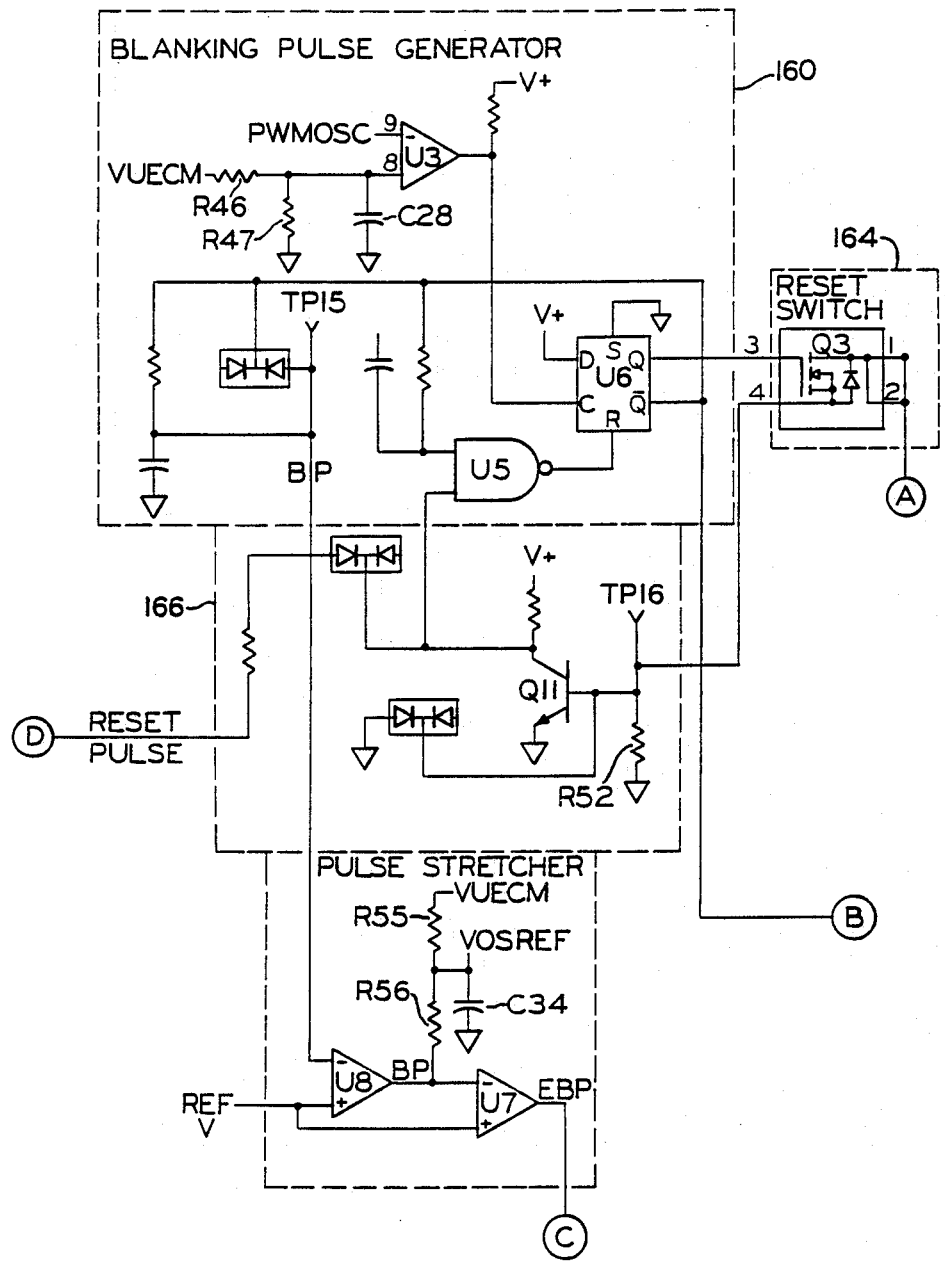
FIG. 8 is a schematic diagram of an electronically commutated motor control circuit according to the invention including three-phase motor current sensing.
Figure 8B:
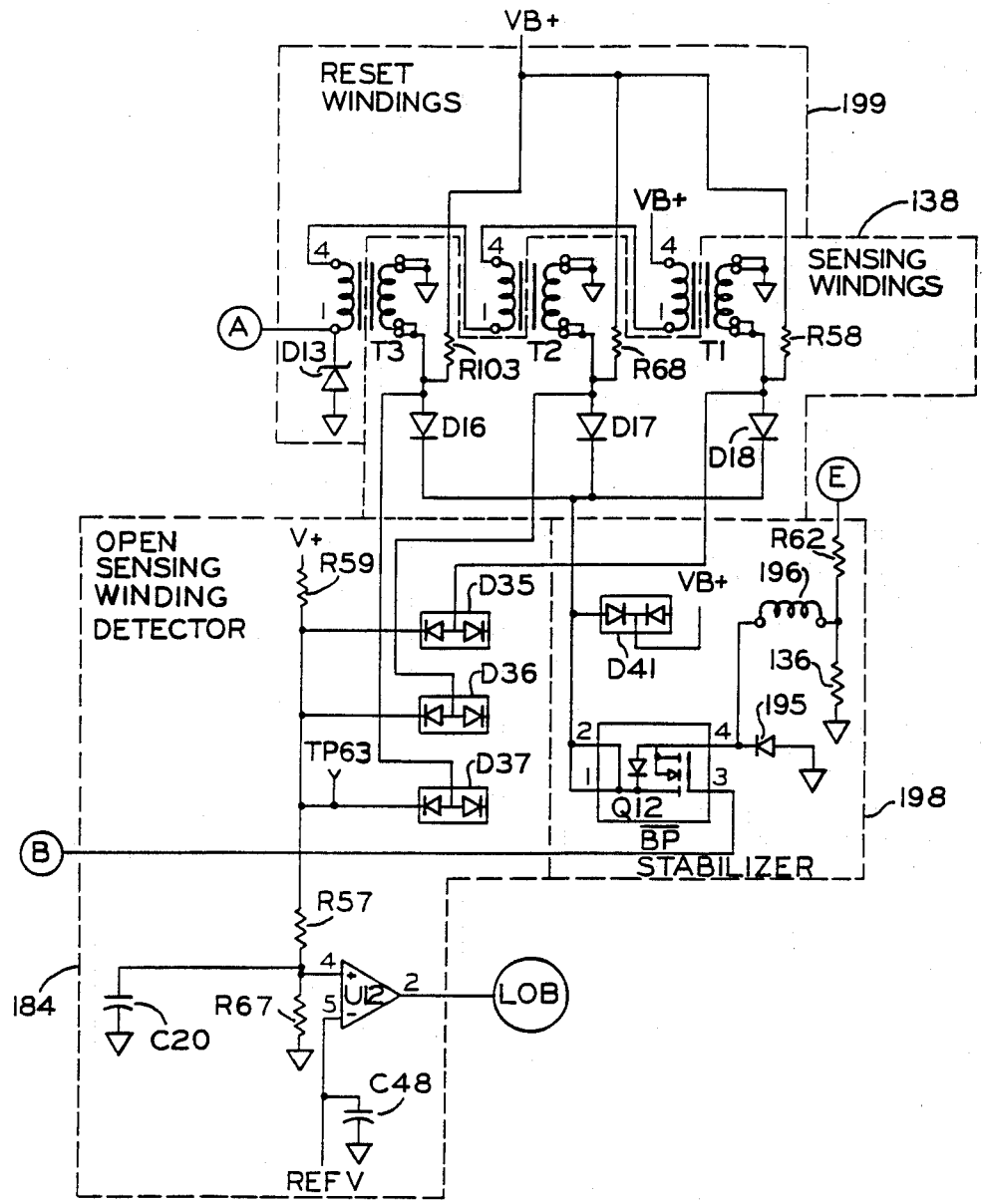

Referring to FIGS. 8A, 8B and 8C, the same reference characters are used in FIGS. 1 and 8 for the same circuitry. FIGS. 8A, 8B and 8C illustrate a control system for an electronically commutated motor having a stationary assembly with a plurality of winding stages for carrying a motor current and further having a rotatable assembly, and which control system is adapted to receive a control signal representing a desired operating torque or speed for the motor. IC 101 constitutes means for applying a motor voltage to one or more of the winding stages at a time in accordance with a regulating signal and for commutating the winding stages in a preselected sequence to rotate the rotatable assembly.

Blanking pulse generator 160 includes flip-flop U6, comparator U3, gate U5. As indicated above, a power device is not permitted to be turned on during the blanking interval. The blanking interval is defined by the pulse width modulated (PWM) oscillating signal applied to non-inverting input pin 9 of comparator U3. A blanking pulse can only be generated when pin 9 is high which corresponds to the period when a voltage is being applied to the motor windings. Reference voltage VUECM divided by resistors R46, R47 and filtered by capacitor C28 is applied to inverting input pin 8 of comparator U3. If a power device is already on, it is permitted to stay or may be switched off since the motor fault during these events would not result in a sudden increase. In other words, the rate of change of motor current during the blanking interval must be predictable. In order to provide this predictability, the power devices are not permitted to be switched on during the blanking interval. If a power device switches off during a blanking interval, this switching is a safe mode during which the current will only decay so that an overcurrent situation cannot exist. Current decay does not present a protection issue. In addition, the large motor inductance results in a very slow current decay. The blanking interval time is approximately 10 to 20 microseconds. The maximum amount of change during the blanking interval, assuming that no switching is going on, amounts to approximately 3 to 4 amperes.

The total blanking time corresponds to a combination of the reset and stabilization intervals. Actually, the blanking pulse corresponds to the reset interval and the stretched portion of the blanking pulse corresponds to the stabilization interval.

The output of comparator U9 is an extended blanking pulse EBP. During the time that each core is reset and during the time that the core is settling (restabilizing to dissipate transients), output 14 of U9 pulls low to blank out the rest of the signal which is being applied to the integrated circuit 101 controlling motor operation. A sample and hold circuit may be used to provide a signal to the IC 101 during the blanking interval rather than blanking out the pulse provided thereto.

The positive edge of the high pulse provided by comparator U3 to clock input C of flip-flop U6 results in the Q output going high and the Q-bar output going low. Pulse stretcher 170 does not permit comparator U8 to release and provide a low output until the stabilization interval has completed. As long as flip-flop U6 is in the state where reset switch 164 is closed and reset current is being applied to the reset windings, then test point TP15 is held low by Q-bar. Reset switch 164 comprises FET Q3. The circuitry will remain in that condition until the reset interval is completed. When the reset interval is completed, test point TP15 will go high which results in the output of comparator U8 trying to release and go high. However, the output of U8 and input pin 8 of comparator U9 do not go high until the pulse stretcher has timed out, i.e., after capacitor C34 is charged by reference voltage VOSCREF and VUECM as divided by resistors R55 and R56 is applied to pin 8.

Flip-flop U6 is released via FET Q3 of reset switch 164. Pin 4 of the FET is connected to test point TP16 which is connected to the base Q11 via resistor R52. Resistor R52 measures the amount of amperes that are in the reset windings. When the reset current reaches a threshold value, say one ampere, a corresponding voltage, say 0.68 volts, will appear across resistor R52 and will be applied to the base of transistor Q11. Resistor R52 has a resistance which generates the voltage level required to turn on Q11. Q11 is part of the threshold detector circuit 166 and, when transistor Q11 turns on, its collector pulls low and current is pulled back through the CMOS NAND gate U5 which puts a high voltage on reset pin R of flip-flop U6 to turn flip-flop U6 off. In summary, a clock pulse into the flip-flop U6 turns reset switch 164 on to reset the core. As current flows through the reset windings as a result of reset pulse applied to the reset windings, the reset current begins to increase rapidly as the core becomes saturated. As soon as that reset current reaches one amp, transistor Q11 turns on to turn flip-flop U6 off and reset its logic. In other words, positive saturation has been accomplished and the reset current may be turned off. At this point, the device progresses through the stabilization interval by extending the blanking pulse by the pulse stretcher 170. The blanking pulse is stretched for approximately 10 microseconds.

The reset current $I_R$ within resistor R52 can be tracked as follows. The source of the current is pin 4 of FET Q3. The current comes into the FET at pins 1 and 2 of the FET. These pins are supplied by zener diode D13 which is a voltage clamp to protect the FET from avalanche. This current comes out of pin 1 of the reset winding of current transformer T3, into pin 4 of the reset winding of transformer T3, out of pin 1 of the reset winding of transformer T2, into pin 4 of the reset winding of transformer T2, out of pin 1 of the reset winding transformer T1 and into pin 4 of the reset winding of transformer T1 from the $V_{B+}$ bias voltage. Therefore, resistor R52 provides a measure of the reset current $I_R$ flowing through the reset windings 199.

Preferably, there are 100 turns in each reset winding and a nominal one ampere reset pulse is applied to the 100 turns. Therefore, there are 100 ampere turns of reset current. When the reset current reaches one ampere, transistor Q11 turns on to change flip-flop U6 into its reset or off state. Flip-flop U6 is latched off until the next clock pulse is received on clock input C.

The PWM oscillator is a clock which is running at approximately 6 kilohertz (150 microsecond pulses). The blanking pulses are synchronized by comparator U3 to the PWM oscillator signal to regulate the current in the motor so that the blanking interval does not occur during the period when a power device would be turned on. At every 6 kilohertz interval, the power devices are turned back on if the devices are not already on. The circuit of FIG. 8 resets the current transformers and does not permit the power devices to be turned back on until after the blanking pulse or blanking interval has been completed. The regulating signal that inhibits the power devices from being turned on is a signal which is applied to pin 24 of IC 101 to strobe off the oscillator thereby preventing the IC 101 from turning the devices back on. The blanking pulse pulls pin 10 of comparator U10 low which results in its output pin 13 going high. When VREG input 24 of IC 101 is high, turning on of the power devices is inhibited.

Pin 25 is a current regulation pin of IC 101 and pin 24 is a voltage regulation pin. The former resets and triggers on a negative edge and the latter triggers on a positive edge. These pins provide different ways of implementing control of the power devices.

Overcurrent limiter 190 comprises comparator U7 which monitors the output of the sensing windings. The output of the sensing windings is fed through resistor 110 and filter capacitor C36 to pin 8 of comparator U7. A reference bias voltage divided by resistors R98 and R99 is filtered by capacitor C50 and applied to pin 9. When the voltage on pin 8 is higher than the voltage on pin 9, output 14 of U7 goes low to shut down IC 101. In other words, overcurrent limiter 190 monitors the total sensing current and compares it to a reference. This overcurrent limiter reference is generally set to correspond to approximately 50 amps. If the current ever exceeds 50 amps, the output of comparator U7, pin 14, goes low to pull the lock-off input (LOB) pin 23 of IC 101 low and turn off IC 101.

Reset pulse detector 176 comprises comparator U11 for verifying that the reset pulse has been provided to the reset windings. This additional protection circuitry is also connected to the LOB input of IC 101. Reset pulse detector 176 verifies that a reset pulse has been provided to the reset windings to positively saturate the cores. For example, suppose one of the reset windings is open circuited. Then, all three reset windings are open circuited because they are connected in series. Applying a reset pulse to open circuit reset windings will not positively saturate the cores. Thereafter, the motor windings will negatively saturate cores which are in the sensing mode and the sensing current will no longer be representative of the motor current.

If transistor Q11 does not swing low, then no reset pulse has been generated. As a result, the RC network comprising resistor R105 and capacitor C38 attached to pin 6 of comparator U11 begins and continues to charge. When this charging voltage becomes higher than the reference voltage applied to pin 7 of comparator U11, i.e., VOSCREF, output pin 1 goes low to shut down the IC 101 via input LOB. In summary, if consistently timed reset pulses are not being generated to reset transistor Q11, reset pulse detector 176 shuts down IC 101 to discontinue motor operation. This prevents further damage to the circuitry or possible demagnetization of the motor.

Open sensing winding detector 184 comprises comparator U12 as a detector to determine whether one of the sensing windings is open circuited. For example, it would detect a bad solder joint, an open wire or a poor connection on the printed wire board with respect to the sensing windings. With these types of defects, the cores would properly be reset to positive saturation, but zero output would be provided by the sensing windings. Therefore, the reset pulse detector 176 would not detect a problem. Rectifying diodes D35, D36 and D37 are each tied to an output of one of the sensing windings and are biased by V+ provided via resistor R59. During the stabilization interval, positive transient spike 704 is induced across each of the sensing windings due excess energy resulting from the sudden termination of the reset pulse. These spikes, in combination, generate a signal at TP63 which charges capacitor C20, via resistive divider R57, R67, to maintain pin 4 high so that output pin 2 of comparator U12 is held high. If one of the sensing windings is open circuited, the signal provided at test point TP63, on the cathode side of diode D37, will not be high enough to maintain capacitor 20 and pin 4 of comparator U12 higher than pin 5 which is connected to reference voltage V via filter capacitor C48. This results in input pin 4 of comparator U12 being lower than pin 5 which, in turn, results in output pin U2 being low to ground the LOB pin of IC 101 to inhibit the system. Once again, this verifies there is an accurate current sensing being accomplished. Detector 184 senses the excess energy driven into the core and, consequently, induced in the sensing windings by the reset pulse and clamped by zener D13.

Open sensing winding detector 184 is required because all power devices are being driven in a current limiting mode. The power devices are turned on until a certain current level is reached, at which point the devices are turned off. Therefore, it is critical to the control of the circuit that the effective motor current be detected at all times. If the effective motor current is not properly detected by the sensing windings, it is necessary to shut down the system. Zero motor current is a valid operating condition so that the open sensing winding detector must determine whether the sensing windings are properly operating. Therefore, both the reset and sensing windings of the circuit are monitored and independently detected for proper operation by the reset pulse detector 176 and the open sensing winding detector 184, respectively.

FET switch Q12 is an optional part of stabilizer 198 for improving stabilization during the stabilization interval. Switch Q12 is a series switch having all three sensing windings tied to its input pins 1 and 2. The output port of switch Q12 is pin 4. The gate of FET Q12 is pin 3 which is driven from Q-bar of flip-flop U6 at pin 12. Whenever reset transistor switch Q3 is on, i.e., during the reset interval, FET Q12 is off. Conversely, when reset transistor switch Q3 is off, FET Q12 is on. FET Q12 removes some of the switching transients which may appear at the output of the sensing windings. As a result, FET Q12 is a series switch operated in synchronism with the reset pulse but in opposite phase thereto. Switch Q12 permits additional stabilization time so that less ideal or slower cores may be used. Generally, it is contemplated that switch Q12 would be used in place of inductor 198. However, in this event, there must be a delay on switch Q12 before it recloses to accommodate stabilization.

During the sensing interval, each sensing winding 138 in the sensing mode generates a sensing current induced by the magnetic field generated by the motor current. The sensing windings are biased by voltage VB+ applied through resistors R103, R68 and R58. The sensing windings are connected in parallel so that rectifying diodes D15, D16 and D17, biased by VB+ via diode D41, determine the polarity of the each sensing winding and prevent sensing windings which are not sensing from shorting out sensing windings which are in the sensing mode. (If a single array of series windings were used for both sensing and reset, then the windings must be driven by separate circuits in the reset mode in order to provide the proper polarities.) The sum of the sensing currents is supplied via stabilizing switch Q12, inductor 196, sensing resistor 136 and limiting resistor R62 to current control 106 as a voltage. Free wheeling diode 195 is connected to inductor 196, as noted above, to permit the inductor to free wheel its energy when switching from the sensing to reset intervals. Therefore, each core and its associated sensing and reset windings constitute means for sensing the effective motor current. Current control 106 constitutes means responsive to the sensing means for generating the regulating signal having a duty cycle which is a function of the control signal and the output signal, whereby the operating torque or speed of the motor is a function of the control signal.

Current control 106 compares the voltage applied to pin 10 of comparator U10 to a control signal applied to pin 11 as filtered by resistor R27 and capacitor C14. Capacitor C16 filters both inputs to comparator U10. The control signal represents the desired operating torque or corresponding speed of the motor whereas the voltage applied to pin 10 represents the actual effective motor current and corresponding torque of the motor. Output pin 13 of comparator U10 goes low whenever the voltage applied to pin 10 exceeds the control signal thereby pulling VREG pin 24 of IC 101 low to discontinue application motor voltage to the motor. This regulating signal applied to pin 24 is biased by voltage VUECM as divided by resistors R30 and R31 and filtered by capacitor C17. A bias voltage is applied to CREG pin 25 of IC 101 because the VREG input is being used in this case to control motor operation. Pulse width modulation of the voltage applied to the motor is controlled by the PWMOSC signal applied to pin 12 of the IC which is filtered by C18 and biased via resistor R33.

Figure 9:
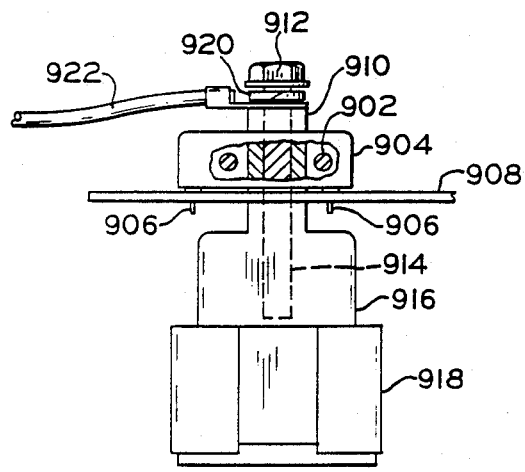
FIG. 9 is a side view, partially in cross-section of a toroidal core mounted to a printed wire board according to the invention.

FIG. 9 illustrates one embodiment for mounting the toroidal cores to a printed wire board. Each toroidal core 902 including its associated windings (not shown) is encased in a core assembly housing 904 having laterally projecting posts 906 for engaging printed wire board (PWB) 908. Each post 906 passes through the PWB 908 to hold housing 904 against one of the surfaces of the PWB. Consequently, toroidal core 902 is located in a plane parallel to the plane defined by the PWB. Conductive sleeve 910 is coaxial with the toroidal core and passes through the center of the toroidal core 904 perpendicular to the PWB. Bolt 912 is coaxial with sleeve 910 and passes through the central, axial opening therein and through the PWB 908 to engage a threaded opening 914 in hybrid module 916. Cooling fins 918 project from module 916 and function as a heat sink for heat generated by the semiconductor power switching devices within the hybrid module. Lock washer 920 is coaxially located on bolt 912 between the head of the bolt and the sleeve. Motor lead 922 from a motor winding (not shown) terminates in terminal 924 located between washer 920 and sleeve 910. As a result, motor current carried to the motor lead 922 flows from the high voltage power source, through hybrid module 916 and via bolt 912 and sleeve 910 through the center of housing 904 and toroid 902. The hybrid is controlled by IC 101 and switches the high voltage signal applied to the motor in accordance with IC 101.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for generating a sensing signal which is a function of a direct current flowing in a particular direction in a conductor comprising:
   means for producing an output signal comprising:
      a core inductively coupled to the conductor, said core being subject to magnetic saturation after a period time as a result of a magnetic field generated by the direct current in the conductor, the aforesaid period of time being a function of the magnitude of the magnetic field generated by the direct current flowing in the conductor;
      an output winding around said core for producing the output signal which is a function of the direct current in the conductor when the core is not saturated but which is not a function of the direct current in the conductor after the aforesaid period of time; and
   means for periodically applying a magnetic field to the core of periodically reset the magnetic orientation of the core of a predefined state before the aforesaid period of time elapses whereby the output signal produced between periodic resets has a magnitude which is a function of the direct current in the conductor and comprises the sensing signal.

2. The apparatus of claim 1 wherein the core is adapted to be driven toward negative magnetic saturation by the direct current in the conductor and wherein said means for periodically applying comprises means for positively magnetically saturating said core before the core becomes negatively magnetically saturated as a result of the magnetic field generated by the direct currrent in the conductor after the aforesaid period of time has elapsed.

3. The apparatus of claim 2 wherein said means for positivity magnetically saturating said core comprises a reset winding around said core and means connected to the reset winding for applying a reset signal thereto adapted to drive said core toward its positively magnetically saturated state.

4. The apparatus of claim 3 wherein said means for applying a reset signal comprises a pulse generator adapted to apply a reset pulse to said reset winding during a periodic reset interval.

5. The apparatus of claim 4 wherein said pulse generator is adapted to provide a blanking pulse adapted to inhibit the sensing signal during the reset interval.

6. The apparatus of claim 5 further comprising a pulse stretcher adapted to extend the blanking pulse for a preset stabilization interval after the core becomes magnetically positively saturated.

7. The apparatus of claim 3 wherein said output winding and said reset winding are a single winding.

8. The apparatus of claim 2 further comprising means for defining a reset interval and wherein said means for positively magnetically saturating said core comprises a reset winding around said core and means connected to said reset winding for applying a reset signal thereto during the reset interval to drive said core toward its positively magnetically saturated state.

9. The apparatus of claim 8 wherein said means for defining a reset interval comprises means for defining a start point of the reset interval and means for defining a stop point of the reset interval.

10. The apparatus of claim 9 wherein said means for defining a stop point of the reset interval comprises means for determining when the core is positively magnetically saturated and providing a stop signal in response thereto.

11. The apparatus of claim 10 wherein said means for determining when the core is magnetically saturated comprises a threshold current detector connected to the reset winding and providing the stop signal when the current in the reset winding is above a predetermined reference.

12. The apparatus of claim 11 wherein said means for defining a start point of the reset interval comprises a capacitor having a potential difference applied thereto and means for comparing the potential difference on the capacitor to a reference and providing a start signal when the potential difference approximately equals the reference.

13. The apparatus of claim 1 wherein said core is a toroidal ferromagnetic member having an axial opening in which the conductor is positioned.

14. The apparauts of claim 13 further comprising a substantially planar printed wire board having first and second surfaces, said toroidal member located adjacent the first surface in a plane substantially parallel to the board, said conductor coaxial with said toroidal member and substantially perpendicular to the board and having a free end and a fixed end passing through the board.

15. The apparatus of claim 14 further comprising means, adjacent the second surface of the board and engaging the fixed end of the conductor, for supplying direct current to the conductor, and means, engaging the free end of the conductor, for conducting the direct current.

16. The apparatus of claim 1 further comprising means for applying a motor voltage to one or more winding stages of a motor in accordance with a regulating signal which is a function of the sensing signal and for commutating winding stages in a preselected sequence to rotate a rotatable assembly of the motor.

17. The apparatus of claim 16 further comprising means for providing a control signal corresponding to a desired operating torque or speed of the motor and means for comparing the sensing signal to the control signal and providing the regulating signal corresponding thereto.

18. The apparatus of claim 17 further comprising means for detecting that the output winding is open circuited and for inhibiting the means for applying a motor voltage in response thereto.

19. The apparatus of claim 16 wherein said means for periodically applying a magnetic field to the core to periodically reset the magnetic orientation of the core comprises a reset winding wound around the core and means connected to the reset winding for applying a reset pulse thereto.

20. The apparatus of claim 19 further comprising means for detecting the reset pulse and for inhibiting the means for applying a motor voltage in the event that the reset pulse is not detected.

21. The apparatus of claim 16 further comprising means for comparing the sensing signal to a reference and for inhibiting the means for applying a motor voltage when the sensing signal is greater than the reference whereby an overcurrent condition is prevented.

22. Apparatus for generating a isolated signal which is a function of the instantaneous total effective current in the winding stages of a motor wherein the stages are wye-connected and have a neutral point, said apparatus comprising:

means for producing winding output signals comprising:
a core inductively coupled to each of the winding stages such that each said core is subject to magnetic saturation after a period of time as a result of a magnetic field generated by the direct current flowing in the respective winding stage toward the neutral point, the aforesaid period of time being a function of the magnitude of the magnetic field generated by the direct current flowing in the winding stages;
a rectified output winding around each said core for producing a winding output signal having a magnitude which is a function of the direct current in the respective winding stage when the direct current flows in the respective winding toward the neutral point before the aforesaid period of time and which is substantially zero when direct current flows in the respective winding toward the neutral point after the aforesaid period of time and which is substantially zero when the direct current flows in the respective winding away from the neutral point; and
means for periodically resetting the magnetic orientation of each core to a predefined state before the aforesaid period of time elapses whereby each winding output signal produced between periodic resets has a magnitude which is a function of the direct current flowing in the respective winding stage toward the neutral point; and
means for summing the winding output signals and providing a sum signal corresponding thereto whereby the sum signal produced between periodic resets has a magnitude which is a function of the instantaneous sum of total effective current in the winding stages of the motor and comprises the isolated signal.

23. The apparatus of claim 22 wherein each core is adapted to be driven toward negative magnetic saturation by the direct current in the respective winding stage and wherein said means for periodically resetting comprises means for positively magnetically saturating each core before it becomes negatively magnetically saturated as a result of the magnetic field generated by the direct current in the respective winding stage after the aforesaid period of time has elapsed.

24. The apparatus of claim 23 wherein said means for positively magnetically saturating each core comprises a reset winding around each core and means connected to each reset winding for applying a reset signal thereto adapted to drive each core toward its positively magnetically saturated state.

25. The apparatus of claim 24 wherein said means for applying a reset signal comprises a pulse generator adapted to apply a reset pulse to each reset winding during a periodic reset interval.

26. The apparatus of claim 25 wherein said pulse generator is adapted to provide a blanking pulse adapted to inhibit the sensing signal during the reset interval.

27. The apparatus of claim 22 wherein said core is a toroidal ferromagnetic member.

28. An apparatus for generating for a signal which is a function of direct current in the winding stages of a motor where the winding stages carry an effective motor current, said apparatus comprising:

means for producing an output signal comprising:
a core inductively coupled to each winding stage, each said core being subject to magnetic saturation after a period of time as a result of a magnetic field generated by the direct current in the winding stage, the aforesaid period of time being a function of the magnitude of the magnetic field generated by the direct current flowing in the winding stages;

an array of rectified output windings, each around one of said cores for producing the output signal which is a function of the effective direct current in the winding stage when the cores are not saturated but which is not a function of the effective direct current in the winding stages after the aforesaid period of time; and means for periodically applying a magnetic field to the cores to periodically reset the magnetic orientation of the cores to a predefined state before the aforesaid period of time elapses whereby the output signal produced between periodic resets has a magnitude which is a function of the effective direct current in the winding stages and comprises the effective motor current.

29. A control system for an electronically commutated motor having a stationary assembly with a plurality of winding stages for carrying a motor current and further having a rotatable assembly, and which control system is adapted to receive a control signal representing a desired operating torque or speed for the motor, the control system comprising:

means for applying a motor voltage to one or more of the winding stages at a time in accordance with a regulating signal and for commutating the winding stages in a preselected sequence to rotate the rotatable assembly;

means for sensing the effective motor current including:

means for producing an output signal comprising:
a core inductively coupled to each winding stage, said core being subject to magnetic saturation after a period of time as a result of a magnetic field generated by the direct current in the winding stage, the aforesaid period of time being a function of the magnitude of the magnetic field generated by the direct current flowing in the conductor;

an array of rectified output windings, each around one of said cores for producing the output signal which is a function of the effective direct current in the winding stage when the cores are not saturated but which is not a function of the effective direct current in the winding stages after the aforesaid period of time; and means for periodically applying a magnetic field to the cores to periodically reset the magnetic orientation of the cores to a predefined state before the aforesaid period of time elapses whereby the output signal produced between periodic resets has a magnitude which is a function of the effective direct current in the winding stages and comprises the effective motor current;

means responsive to the sensing means for generating the regulating signal having a duty cycle which is a function of the control signal and the output signal, whereby the operating torque or speed of the motor is a function of the control signal.

30. A control system for an electronically commutated motor having a stationary assembly with a plurality of winding stages for carrying a motor current and further having a rotatable assembly, the control system being adapted to receive a control signal representing a desired operating torque or speed for the motor, the control system being operatively connected to a commutating circuit for applying a motor voltage to one or more of the winding stages at a time in accordance with a regulating signal and for commutating the winding stages in a preselected sequence to rotate the rotatable assembly, the control system comprising:

means for sensing the effective motor current including:

means for producing an output signal comprising:
a core inductively coupled to each winding stage, said core being subject to magnetic saturation after a period of time as a result of a magnetic field generated by the direct current in the winding stage, the aforesaid period of time being a function of the magnitude of the magnetic field generated by the direct current flowing in the conductor;

an array of rectified output windings, each around one of said cores for producing the output signal which is a function of the effective direct current in the winding stage when the cores are not saturated but which is not a function of the effective direct current in the winding stages after the aforesaid period of time; and means for periodically applying a magnetic field to the cores to periodically reset the magnetic orientation of the cores to a a predefined state before the aforesaid period of time elapses whereby the output signal produced between periodic resets has a magnitude which is a function of the effective direct current in the winding stages and comprises the effective motor current; and means responsive to the sensing means for generating the regulating signal having a duty cycle which is a function of the control signal and the output signal, whereby the operating torque or speed of the motor is a function of the duty cycle of the control pulses.

31. Apparatus for generating a sensing signal which is a function of an effective direct current flowing in a conductor comprising:

means for producing a first output signal comprising:
a first core inductively coupled to the conductor, said first core being subject to magnetic saturation after a first period of time as a result of a magnetic field generated by the direct current in one direction in the conductor, the first period of time being a function of the magnitude of the magnetic field generated by the direct current flowing in the one direction in the conductor;

a first output winding around said first core for producing the first output signal which is a function of the direct current in the one direction in the conductor when the first core is not saturated but which is substantially zero when current flows in the one direction after the first period of time and which is substantially zero when the current flows in the other direction; and means for periodically applying a magnetic field to the first core to periodically reset the magnetic orientation of the first core to a predefined state before the first period of time elapses whereby the first output signal produced between periodic resets has a magnitude which is a function of the direct current in the one direction in the conductor;

means for producing a second output signal comprising:
a second core inductively coupled to the conductor, said second core being subject to positive magnetic saturation after a second period of time as a result of a magnetic field generated by the direct current in the other direction in the conductor, the second period of time being a function of the magnitude of the magnetic field generated by the direct current flowing in the other direction in the conductor; and a second output winding around said second core for producing the second output signal which is a function of the direct current in the other direction in the conductor when the second core is not saturated but which is substantially zero when current flows in the other direction after the second period of time and which is substantially zero when the current flows in the one direction;

means for periodically applying a magnetic field to the second core to periodically reset the magnetic orientation of the second core to the predefined state before the second period of time elapses whereby the second output signal produced between periodic resets has a magnitude which is a function of the direct current in the other direction in the conductor; and means for summing the first and second output signals and providing a sum signal corresponding thereto whereby the sum signal produced between periodic resets has a magnitude which is a function of the effective direct current in the conductor and comprises the sensing signal.

32. The apparatus of claim 31 wherein said first and second output windings are rectified and connected in parallel and wherein the sum signal is directly proportional to the direct current in the conductor between periodic resets.

33. The apparatus of claim 32 further comprising means for defining a reset interval, wherein said means for periodically applying a magnetic field to the first core comprises a first reset winding around said first core and wherein said means for periodically applying a magnetic field to the second core comprises a second reset winding around said second core and further comprising means connected to each said reset winding for applying a reset signal thereto during the reset interval to drive each said core toward the predefined state.

34. The apparatus of claim 33 wherein said predefined state comprises positive magnetic saturation.

35. The apparatus of claim 33 wherein said predefined state comprises negative magnetic saturation.

36. Method for generating a sensing signal which is a function of a direct current flowing in a particular direction in a conductor comprising the steps of:
producing an output signal comprising the steps of:
inductively coupling a core to the conductor, said core being subject to magnetic saturation after a period of time as a result of a magnetic field generated by the direct current in the conductor, the aforesaid period of time being a function of the magnitude of the magnetic field generated by the direct current flowing in the conductor;
producing from an output winding around said core the output signal which is a function of the direct current in the conductor when the core is not saturated but which is not a function of the direct current in the conductor after the aforesaid period of time; and
periodically applying a magnetic field to the core to periodically reset the magnetic orientation of the core to a predefined state before the aforesaid period of time elapses whereby the output signal produced between periodic resets has a magnitude which is a function of the direct current in the conductor and comprises the sensing signal.

37. The method of claim 36 wherein the core is adapted to be driven toward negative magnetic saturation by the direct current in the conductor and wherein said step of periodically applying comprises the step of positively magnetically saturating said core before the core becomes negatively magnetically saturated as a result of the magnetic field generated by the direct current in the conductor after the aforesaid period of time has elapsed.

38. The method of claim 37 wherein said core has a reset winding around it and said step of positively magnetically saturating said core comprises the step of applying to the reset winding a reset signal adapted to drive said core toward its positively magnetically saturated state.

39. The method of claim 38 wherein said step of applying a reset signal comprises the step of applying a reset pulse to said reset winding during a periodic reset interval.

40. The method of claim 39 further comprising the step of providing a blanking pulse adapted to inhibit the sensing signal during the reset interval.

41. The method of claim 40 further comprising the step of providing and extended blanking pulse for a preset stabilization interval after the core becomes magnetically positively saturated.

42. The method of claim 38 wherein said output winding and said reset winding are a single winding.

43. The method of claim 37 further comprising the step of defining a reset interval and wherein said core has a reset winding around it and said step of positively magnetically saturating said core comprises the step of applying a reset signal to the reset winding during the reset interval to drive said core toward its positively magnetically saturated state.

44. The method of claim 43 wherein said step of defining a reset interval comprises the step of defining a start point of the reset interval and defining a stop point of the reset interval.

45. The method of claim 44 wherein said step of defining a stop point of the reset interval comprises the step of determining when the core is positively magnetically saturated and providing a stop signal in response thereto.

46. The method of claim 45 wherein said step of determining when the core is magnetically saturated comprises the step of providing the stop signal when the current in the reset winding is above a predetermined reference.

47. The method of claim 46 wherein said step of defining a start point of the reset interval comprises the step of comparing the potential difference on a charging capacitor to a reference and providing a start signal when the potential difference approximately equals the reference.

48. The method of claim 36 wherein said core is a toroidal ferromagnetic member having an axial opening in which the conductor is positioned.

49. The method of claim 48 further comprising the steps of:
providing a substantially planar printed wire board having first and second surfaces, locating said member adjacent the first surface in a plane substantially parallel to the board, said conductor coaxial with said toroidal member and substantially perpendicular to the board and having a free end and a fixed end passing through the board.

50. The method of claim 49 further comprising the steps of supplying direct current to the fixed end of the conductor, and conducting the direct current from the free end of the conductor.

51. The method of claim 36 further comprising the steps of applying a motor voltage to one or more winding stages of a motor in accordance with a regulating signal which is a function of the sensing signal and commutating the winding stages in a preselected sequence to rotate a rotatable assembly of the motor.

52. The method of claim 51 further comprising the steps of providing a control signal corresponding to a desired operating torque or speed of the motor and comparing the sensing signal to the control signal and providing the regulating signal corresponding thereto.

53. The method of claim 52 further comprising the step of detecting that the output winding is open circuited and inhibiting the applying a motor voltage in response thereto.

54. The method of claim 51 wherein said core has a reset winding around it and said step of periodically resetting the magnetic orientation of the core comprises the step of applying a reset pulse to the reset winding during the reset interval.

55. The method of claim 54 further comprising the steps of detecting the reset pulse during the reset interval and inhibiting the step of applying a motor voltage in the event that the reset pulse is not detected during the reset interval.

56. The method of claim 51 further comprising the step of comparing the sensing signal to a reference and inhibiting the step of applying a motor voltage when the sensing signal is greater than the reference whereby an overcurrent condition is prevented.

57. Method for generating an isolated signal which is a function of the instantaneous total effective current in the winding stages of a motor wherein the stages are wye-connected and have a neutral point, said method comprising the steps of:
produce winding output signals comprising the steps of:
inductively coupling a core to each of the winding stages such that each said core is subject to magnetic saturation after a period of time as a result of a magnetic field generated by the direct current flowing in the respective winding stage toward the neutral point, the aforesaid period of time being a function of the magnitude of the magnetic field generated by the direct current flowing in the conductor;
producing from a rectified output winding around each core a winding output signal having a magnitude which is a function of the direct current in the respective winding stage when the direct current flows in the respective winding toward the neutral point before the aforesaid period of time and which is substantially zero when direct current flows in the respective winding toward the neutral point after the aforesaid period of time and which is substantially zero when the direct current flows in the respective winding away from the neutral point; and
periodically applying a magnetic field to each core to periodically reset the magnetic orientation of each core to a predefined state before the aforesaid period of time elapses whereby each winding output signal produced between periodic resets has magnitude which is a function of the direct current flowing in the respective winding stage toward the neutral point; and
summing the winding output signals and providing a sum signal corresponding thereto whereby the sum signal produced between periodic resets has a magnitude which is a function of the instantaneous sum of total effective current in the winding stages of the motor and comprises the isolated signal.

58. The method of claim 57 wherein each core is adapted to be driven toward negative magnetic saturation by the direct current in the respective winding stage and wherein said step of periodically applying comprises the step of positively magnetically saturating each core before it becomes negatively magnetically saturated as a result of the magnetic field generated by the direct current in the respective winding stage after the aforesaid period of time has elapsed.

59. The method of claim 58 further comprising a reset winding around each core and wherein said step of positively magnetically saturating each core comprises the step of applying a reset signal to the reset winding adapted to drive each core toward its positively magnetically saturated state.

60. The method of claim 59 wherein said step of applying a reset signal comprises the step of applying a reset pulse to each reset winding during a periodic reset interval.

61. The method of claim 60 further comprising the step of providing a blanking pulse adapted to inhibit the sensing signal during the reset interval.

62. The method of claim 57 wherein said core is a toroidal ferromagnetic member.

63. A method for generating a signal which is a function of direct current in the winding stages of a motor where the winding stages carry an effective motor current, said method comprising the steps of:
producing an output signal comprising the steps of:
inductively coupling a core to each winding stage, said core being subject to magnetic saturation after a period of time as a result of a magnetic field generated by the direct current in the winding stage, the aforesaid period of time being a function of the magnitude of the magnetic field generated by the direct current flowing in the conductor;
producing from a series array of rectified output windings, each around one of said cores the output signal which is a function of the effective direct current in the winding stage when the cores are not saturated but which is not a function of the effective direct current in the winding stages after the aforesaid period of time; and
periodically applying a magnetic field to the cores to periodically reset the magnetic orientation of the cores to a predefined state before the aforesaid period of time elapses whereby the output signal produced between periodic resets has a magnitude which is a function of the effective direct current in the winding stages and comprises the effective motor current.

64. A control method for an electronically commutated motor having a stationary assembly with a plurality of winding stages for carrying a motor current and further having a rotatable assembly, and which control method is adapted to receive a control signal representing a desired operating torque or speed for the motor, the control method comprising the steps of:

applying a motor voltage to one or more of the winding stages at a time in accordance with a regulating signal and commutating the winding stages in a preselected sequence to rotate the rotatable assembly;

sensing the effective motor current including:

producing an output signal comprising the steps of:

inductively coupling a core to each winding stage, said core being subject to magnetic saturation after a period of time as a result of a magnetic field generated by the direct current in the winding stage, the aforesaid period of time being a function of the magnitude of the magnetic field generated by the direct current flowing in the conductor;

producing from a series array of rectified output windings, each around one of said cores the output signal which is a function of the effective direct current in the winding stage when the cores are not saturated but which is not a function of the effective direct current in the winding stages after the aforesaid period of time; and periodically applying a magnetic field to the cores to periodically reset the magnetic orientation of the cores to a predefined state before the aforesaid period of time elapses whereby the output signal produced between periodic resets has a magnitude which is a function of the effective direct current in the winding stages and comprises the effective motor current;

generating in response to the sensing step the regulating signal having a duty cycle which is a function of the control signal and the output signal, whereby the operating torque or speed of the motor is a function of the control signal.

65. A control method for an electronically commutated motor having a stationary assembly with a plurality of winding stages for carrying a motor current and further having a rotatable assembly, the control method being adapted to receive a control signal representing a desired operating torque or speed for the motor, the control method being operatively connected a commutating circuit for applying a motor voltage to one or more of the winding stages at a time in accordance with a regulating signal and for commutating the winding stages in a preselected sequence to rotate the rotatable assembly, the control method comprising the steps of:

sensing the effective motor current including:

producing an output signal comprising the steps of:

inductively coupling a core to each winding stage, said core being subject to magnetic saturation after a period of time as a result of a magnetic field generated by the direct current in the winding stage, the aforesaid period of time being a function of the magnitude of the magnetic field generated by the direct current flowing in the conductor;

producing from a series array of rectified output windings, each around one of said cores the output signal which is a function of the effective direct current in the winding stage when the cores are not saturated but which is not a function of the effective direct current in the winding stages after the aforesaid period of time; and periodically applying a magnetic field to the cores to periodically reset the magnetic orientation of the cores to a predefined state before the aforesaid period of time elapses whereby the output signal produced between periodic resets has a magnitude which is a function of the effective direct current in the winding stages and comprises the effective motor current; and generating in response to the sensing step the regulating signal having a duty cycle which is a function of the control signal and the output signal, whereby the operating torque or speed of the motor is a function of the duty cycle of the control pulses.

66. Method for generating a sensing signal which is a function of an effective direct current flowing in a conductor comprising the steps of:

producing a first output signal comprising the steps of:

inductively coupling a first core to the conductor, said first core being subject to magnetic saturation after a first period of time as a result of a magnetic field generated by the direct current in one direction in the conductor, the first period of time being a function of the magnitude of the magnetic field generated by the direct current flowing in the one direction in the conductor;

producing from a first output winding around said first core the first output signal which is a function of the direct current in the one direction in the conductor when the first core is not saturated but which is substantially zero when current flows in the one direction after the first period of time and which is substantially zero when the current flows in the other direction; and periodically applying a magnetic field to the first core to periodically reset the magnetic orientation of the first core to a predefined state before the first period of time elapses whereby the first output signal produced between periodic resets has a magnitude which is a function of the direct current in the one direction in the conductor;

producing a second output signal comprising the steps of:

inductively coupling a second core to the conductor, said second core being subject to positive magnetic saturation after a second period of time as a result of a magnetic field generated by the direct current in the other direction in the conductor, the second period of time being a function of the magnitude of the magnetic field generated by the direct current flowing in the other direction in the conductor; and producing from a second output winding around said second core the second output signal which is a function of the direct current in the other direction in the conductor when the second core is not saturated but which is substantially zero when current flows in the other direction after the second period of time and which is substantially zero when the current flows in the one direction;

periodically applying a magnetic field to the second core to periodically reset the magnetic orientation of the second core to the predefined state before the second period of time elapses whereby the second output signal produced between periodic resets has a magnitude which is a function of the direct current in the other direction in the conductor; and summing the first and second output signals and providing a sum signal corresponding thereto whereby the sum signal produced between periodic resets has a magnitude which is a function of the effective direct current in the conductor and comprises the sensing signal.

67. The method of claim 66 wherein said first and second output windings are rectified and connected in parallel and wherein the sum signal is directly proportional to the direct current in the conductor between periodic resets.

68. The method of claim 67 further comprising a first reset winding around said core and a second reset winding around said second core and further comprising the steps of defining a reset interval, and wherein said steps of periodically applying a the magnetic field to the first and second cores comprises the step of applying a reset signal to the first and second reset windings during the reset interval to drive each said core toward the predefined state.

69. The method of claim 68 wherein said predefined state comprises positive magnetic saturation.

70. The method of claim 68 wherein said predefined state comprises negative magnetic saturation.

* * * * *